(12) United States Patent
Liu

(10) Patent No.: US 12,368,426 B2
(45) Date of Patent: Jul. 22, 2025

(54) METHOD FOR FORMING BULK ACOUSTIC WAVE RESONANCE DEVICE

(71) Applicant: CHANGZHOU CHEMSEMI CO., LTD., Changzhou (CN)

(72) Inventor: Yuhao Liu, Shanghai (CN)

(73) Assignee: CHANGZHOU CHEMSEMI CO., LTD., Changzhou (CN)

( * ) Notice: Subject to any disclaimer, the term of this patent is extended or adjusted under 35 U.S.C. 154(b) by 808 days.

(21) Appl. No.: 17/640,338

(22) PCT Filed: Sep. 5, 2019

(86) PCT No.: PCT/CN2019/104600
§ 371 (c)(1),
(2) Date: Aug. 29, 2022

(87) PCT Pub. No.: WO2021/042343
PCT Pub. Date: Mar. 11, 2021

(65) Prior Publication Data
US 2022/0407487 A1  Dec. 22, 2022

(51) Int. Cl.
  *H03H 3/02* (2006.01)
  *H03H 9/02* (2006.01)
  *H03H 9/17* (2006.01)

(52) U.S. Cl.
  CPC ......... *H03H 3/02* (2013.01); *H03H 2003/021* (2013.01); *H03H 9/02015* (2013.01); *H03H 9/173* (2013.01)

(58) Field of Classification Search
  CPC ...... H03H 3/02; H03H 9/02015; H03H 9/173; H03H 9/0523; H03H 2003/021; H03H 9/02118; Y10T 29/42; Y10T 29/49005
  See application file for complete search history.

(56) References Cited

U.S. PATENT DOCUMENTS

| | | | |
|---|---|---|---|
| 10,355,659 B2 * | 7/2019 | Kim | H03H 9/0523 |
| 11,005,448 B2 * | 5/2021 | Wang | H03H 9/02007 |
| 2007/0157442 A1 | 7/2007 | Ha et al. | |

FOREIGN PATENT DOCUMENTS

| | | | |
|---|---|---|---|
| CN | 101908865 A | 12/2010 | |
| CN | 107222181 A | 9/2017 | |

(Continued)

OTHER PUBLICATIONS

European Patent Office, Extended European Search Report Issued in Application No. 19944046.2, May 12, 2023, Germany, 7 pages.

*Primary Examiner* — Donghai D Nguyen
(74) *Attorney, Agent, or Firm* — Kilpatrick Townsend & Stockton LLP

(57) ABSTRACT

A method for forming a bulk acoustic wave resonance device is provided, including forming a first stack, wherein forming the first stack includes: providing a first substrate; forming a piezoelectric layer on the first substrate; forming a first electrode layer on the piezoelectric layer; and forming a cavity pretreatment layer on the piezoelectric layer, wherein a first side of the first stack corresponds to a side of the first substrate, and a second side of the first stack corresponds to a side of the cavity pretreatment layer; forming a second stack, wherein forming the second stack includes providing a second substrate; joining the first stack and the second stack, wherein the second stack is disposed at the second side of the first stack; removing the first substrate; and forming a second electrode layer at the first side of the first stack and in contact with the piezoelectric layer.

39 Claims, 11 Drawing Sheets

(56) References Cited

FOREIGN PATENT DOCUMENTS

| | | | |
|---|---|---|---|
| CN | 107809221 | A | 3/2018 |
| CN | 109150135 | A | 1/2019 |
| CN | 109905098 | A | 6/2019 |
| JP | 2006186412 | A | 7/2006 |

\* cited by examiner

200

| a first stack is formed, wherein forming the first stack includes: providing a first substrate; forming a piezoelectric layer on the first substrate; forming a first electrode layer on the piezoelectric layer; and forming a cavity pretreatment layer on the piezoelectric layer, wherein a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, wherein a first side of the first stack corresponds to a side of the first substrate, and a second side of the first stack corresponds to a side of the cavity pretreatment layer | —— S201 |

| a second stack is formed, wherein forming the second stack includes providing a second substrate | —— S203 |

| joining the first stack and the second stack, wherein the second stack is disposed at the second side of the first stack | —— S205 |

| removing the first substrate, wherein the first side of the first stack corresponds to a side of the piezoelectric layer | —— S207 |

| forming a second electrode layer at the first side of the first stack, wherein the second electrode layer is in contact with the piezoelectric layer | —— S209 |

| the cavity pretreatment layer is etched to form the cavity, wherein the first end of the first electrode layer is disposed in the cavity | —— S211 |

FIG. 2

METHOD FOR FORMING BULK ACOUSTIC WAVE RESONANCE DEVICE

CROSS-REFERENCE TO RELATED APPLICATIONS

This application is a National Stage of International Application No. PCT/CN2019/104600, filed on Sep. 5, 2019, the contents of which are incorporated herein by reference.

FIELD

The present disclosure relates to the field of semiconductors, and in particular to a method for forming a bulk acoustic wave resonance device.

BACKGROUND

A Radio Frequency (RF) front-end chip of a wireless communication device includes a power amplifier, an antenna switch, an RF filter, a duplexer, a multiplexer and a low noise amplifier, etc. The RF filter includes a Surface Acoustic Wave (SAW) filter, a Bulk Acoustic Wave (BAW) filter, a Micro-Electro-Mechanical System (MEMS) filter, and an Integrated Passive Device (IPD) filter, etc. As both SAW resonator and BAW resonator have a high quality value (Q value), an RF filter including a SAW resonator, namely a SAW filter, and that including a BAW resonator, namely a BAW filter, have low insertion loss and high out-of-band rejection, and thus become current mainstream RF filters used by wireless communication devices such as mobile phones and base stations. The Q value is a quality factor value of a resonator, and is defined by a center frequency divided by 3 dB bandwidth of the resonator. An application frequency of the SAW filter is generally from 0.4 GHz to 2.7 GHz, and an application frequency of the BAW filter is generally from 0.7 GHz to 7 GHz.

Compared with a SAW resonator, a BAW resonator has better performance, but manufacturing cost of the BAW resonator is higher than that of the SAW resonator due to more complicated process. However, as wireless communication technology gradually evolves, more and more frequency bands are used. In one embodiment, with the application of frequency band superposition technology such as carrier aggregation, mutual interference between wireless frequency bands becomes more and more serious. High performance BAW technology can avoid or mitigate the mutual interference between wireless frequency bands. With the advent of 5G era, wireless mobile networks have adopted higher frequency bands, and currently, merely BAW technology can solve a filtering problem at high frequency.

FIG. 1a illustrates a BAW filter circuit including a ladder circuit consisting of BAW resonators, where f1, f2, f3 and f4 represent four different frequencies, respectively. Within each BAW resonator, alternating voltages with different polarities are supplied to metal electrodes at both sides of a piezoelectric layer of the resonator, an acoustic wave is generated by the piezoelectric layer under the alternating voltages with different polarities, and the acoustic wave within the resonator propagates along a direction perpendicular to the piezoelectric layer. To form resonance, the acoustic wave requires to be totally reflected on an upper surface of an upper metal electrode and on a lower surface of a lower metal electrode to form a standing acoustic wave. A condition for an acoustic wave reflection is that an acoustic impedance of medium in contact with the upper surface of the upper metal electrode and the lower surface of the lower metal electrode is quite different from that of a metal electrode.

A Film Bulk Acoustic Wave Resonator (FBAR) is a kind of BAW resonator which can restrain acoustic wave energy inside the resonator. Above a resonance region of the BAW resonator is air or vacuum, and below the resonance region of the BAW resonator is a cavity. As the acoustic impedance of air is quite different from that of metal electrodes, acoustic waves can be totally reflected on an upper surface of an upper metal electrode and a lower surface of a lower metal electrode to form a standing wave.

FIG. 1b illustrates a schematic structural view of a cross-section of an FBAR 100. The FBAR 100 includes a substrate 101, an electrode layer 105, a piezoelectric layer 107 and an electrode layer 109. The substrate 101 includes a cavity 103 embedded at an upper surface thereof. The electrode layer 105 is disposed on the substrate 101 and the cavity 103. The piezoelectric layer 107 is disposed on the substrate 101 and covers the electrode layer 105. The piezoelectric layer 107 includes a convex part 107a. The electrode layer 109 is disposed on the piezoelectric layer 107 and includes a convex part 109a disposed on the convex part 107a. A resonance region 111 (i.e., an overlap region of the electrode layer 105 and the convex part 109a) is disposed above the cavity 103, and not only overlaps with but also touches the substrate 101. The FBAR 100 is formed by stacking layers, including forming the electrode layer 105 on the substrate 101, forming the piezoelectric layer 107 on the electrode layer 105 and the substrate 101, and forming the electrode layer 109 on the piezoelectric layer 107. As the electrode layer 105 protrudes above the substrate 101, forming the piezoelectric layer 107 directly on the electrode layer 105 and the substrate 101 may cause some crystal grains in the piezoelectric layer 107, for example, some crystal grains in both side portions 115 of the convex part 107a, to suffer from a significant change to their orientation and to be not parallel to other crystal grains, for example, some crystal grains in a middle portion 117 of the convex part 107a, which may cause a decrease in an electromechanical coupling factor and a Q value of the FBAR. In addition, the FBAR 100 formed by stacking layers may not be flexible.

SUMMARY

The present disclosure is to provide a method for forming a bulk acoustic wave resonance device, which enables a piezoelectric layer not to include crystal grains which suffer from a significant change to their orientation, to improve an electromechanical coupling factor and a Q value of resonator device. In addition, a substrate and active layers (including at least a piezoelectric layer, a lower electrode layer, such as the electrode layer 105, and an upper electrode layer, such as the electrode layer 109) may be processed separately, which allows the forming method of the resonant device to be flexible.

Embodiments of the present disclosure provide a bulk acoustic wave resonance device, including: forming a first stack, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer; forming a second stack, and forming the second stack includes providing a second substrate; joining the first stack and the second stack, and the second stack is disposed at the second side of the first stack; removing the first substrate, and the first side of the first stack corresponds to a side of the piezoelectric layer; and forming a second electrode layer at the first side of the first stack, and the second electrode layer is in contact with the piezoelectric layer.

The piezoelectric layer is formed on a flat surface of the first substrate, which enables the piezoelectric layer not to include crystal grains which suffer from a significant change to their orientation, to improve an electromechanical coupling factor and a Q value of the resonator device. In addition, the second substrate and the active layers (including at least the piezoelectric layer, the first electrode layer, and the second electrode layer) may be processed separately, which allows the forming method of the resonant device to be flexible.

In some embodiments, forming a cavity pretreatment layer includes forming a sacrificial layer on the piezoelectric layer and covering the first end of the first electrode layer. In some embodiments, the sacrificial layer is made of one or more materials selected from but not limited to a group consisting of polymer, silicon dioxide, doped silicon dioxide, and polysilicon. In some embodiments, the polymer includes at least one selected from but not limited to a group consisting of Benzocyclobutene (BCB), photosensitive epoxy resin photoresist, such as SU-8, and polyimide. It should be noted that the doped silicon dioxide includes silicon dioxide doped with other elements.

In some embodiments, forming the cavity pretreatment layer further includes: forming a first intermediate layer on the piezoelectric layer and covering at least the sacrificial layer, and the second side of the first stack corresponds to a side of the first intermediate layer. In some embodiments, the first intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide. In some embodiments, the first intermediate layer further covers a second end of the first electrode layer.

In some embodiments, the first substrate is made of one or more materials selected from but not limited to a group consisting of silicon, silicon carbide and glass.

In some embodiments, the piezoelectric layer includes crystal grains including a first crystal grain and a second crystal grain, and the first crystal grain and the second crystal grain are any two crystal grains among crystal grains, a first coordinate axis along a first direction corresponds to a height of the first crystal grain, a second coordinate axis along a second direction corresponds to a height of the second crystal grain, and the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first crystal grain corresponds to a first coordinate system including the first coordinate axis and a third coordinate axis along a third direction, and the second crystal grain corresponds to a second coordinate system including the second coordinate axis and a fourth coordinate axis along a fourth direction.

In some embodiments, the first coordinate system further includes a fifth coordinate axis along a fifth direction, and the second coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer includes crystal grains, and a crystal composed of crystal grains has a full width at half maximum of a rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve represents a crystal quality, and the smaller the full width at half maximum of the rocking curve is, the higher the crystal quality is. In addition, the Full Width at Half Maximum (FWHM) refers to an interval between two points whose function values are equal to a half of a peak value of the function.

In some embodiments, forming the second stack further includes forming a second intermediate layer on the second substrate. In some embodiments, the second intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

In some embodiments, forming the second stack further includes forming a film between the second substrate and the second intermediate layer. In some embodiments, the film includes but is not limited to a polycrystalline film. In some embodiments, the polycrystalline film is made of one or more materials selected from but not limited to a group consisting of polysilicon, polycrystalline silicon nitride, and polycrystalline silicon carbide. It should be noted that the film between the second substrate and the second intermediate layer helps to prevent formation of a free electron layer on the surface of the second substrate, to reduce an electric loss caused by the second substrate.

In some embodiments, the second substrate is made of one or more materials selected from but not limited to a group consisting of silicon, silicon carbide and glass.

In some embodiments, joining the first stack and the second stack includes: bonding the first intermediate layer and the second intermediate layer to form a third intermediate layer. In some embodiments, a thickness of the third intermediate layer is within but not limited to a range from 0.1 micrometer to 10 micrometers. It should be noted that acoustic impedance of the third intermediate layer may be relatively smaller to that of the piezoelectric layer to reduce leaky waves propagating from the resonance region to the second substrate.

In some embodiments, the first electrode layer is made of one or more materials selected from but not limited to a group consisting of molybdenum, ruthenium, tungsten, platinum, iridium and aluminum, and the second electrode layer is made of one or more materials selected from but not limited to a group consisting of molybdenum, ruthenium, tungsten, platinum, iridium and aluminum.

In some embodiments, the method further including: removing the sacrificial layer to form the cavity, and the first end of the first electrode layer is disposed in the cavity.

In some embodiments, forming the cavity pretreatment layer further includes: prior to forming the first intermediate layer, forming an etching shield layer on the piezoelectric layer and covering at least the sacrificial layer. In some embodiments, the etching shield layer is made of one or more materials selected from but not limited to a group consisting of aluminum nitride, silicon carbide, diamond, silicon nitride, silicon dioxide, aluminum oxide and titanium dioxide. In some embodiments, the etching shield layer has a thickness within a range from 0.1 micrometer to 3 micrometers. It should be noted that the etching shield layer may serve to protect the first intermediate layer while forming the cavity by etch. In addition, the etching shield layer may serve to protect the resonance device from being corroded by water or oxygen.

In some embodiments, forming a piezoelectric layer includes: forming a first sub-piezoelectric layer on the first substrate; and forming a second sub-piezoelectric layer on the first sub-piezoelectric layer. In some embodiments, a full width at half maximum of a rocking curve of the first sub-piezoelectric layer is greater than 1.7 degrees, and a full width at half maximum of a rocking curve of the second sub-piezoelectric layer is smaller than 1.7 degrees. In some embodiments, the method further includes: following removing the first substrate, removing the first sub-piezoelectric layer, and the first side of the first stack corresponds to a side of the second sub-piezoelectric layer. It should be noted that a full width at half maximum of a rocking curve being smaller than 1.7 degrees represents a relatively high crystal quality, while a full width at half maximum of a rocking curve being greater than 1.7 degrees represents a relatively low crystal quality. The crystal quality of the piezoelectric layer may be affected when the first substrate is removed. Therefore, the piezoelectric layer with a two-layer structure is adopted. After the first substrate is removed, the first sub-piezoelectric layer with low crystal quality is removed, and the second sub-piezoelectric layer with high crystal quality is retained, to further improve the electromechanical coupling factor and the Q value of the resonance device.

In some embodiments, forming the first stack further includes: forming a photoetching mark prior to forming the piezoelectric layer. In some embodiments, forming a photoetching mark includes: forming an opening at an end of the first substrate; and forming the photoetching mark in the opening. In some embodiments, the method further includes: following removing the first substrate, retaining the photoetching mark at the first side of the first stack and in contact with the piezoelectric layer.

In some embodiments, the method further includes: prior to forming the second electrode layer, forming an edge structure at the first side of the first stack and in contact with the piezoelectric layer. In some embodiments, forming the second electrode layer includes: forming the second electrode layer at an inner side of the edge structure. It should be noted that the edge structure is disposed outside an edge of the second electrode layer, and forms a surrounding edge to the second electrode layer, to restrain a leakage of transverse waves, which may increase the Q value of the resonance device. In addition, the edge structure is disposed within the resonance region. In some embodiments, the edge structure is a ring structure.

In some embodiments, forming an edge structure includes but is not limited to, forming a metal edge structure at the first side of the first stack and in contact with the piezoelectric layer. In some embodiments, forming the edge structure further includes: etching an inner side of the metal edge structure (i.e., an inner side of the edge structure) to form a slope. In some embodiments, an etching angle for etching the inner side of the metal edge structure is within a range from 1 degree to 89 degrees. It should be noted that the slope is formed at the inner side of the edge structure, and an outer side of the edge structure keeps upright, which may increase impedance of the edge structure, to better restrain a leakage of transverse waves.

It should be noted that the photoetching mark has a calibration function. During the formation of the edge structure or the second electrode layer, alignment with respect to the photoetching mark improves accuracy.

BRIEF DESCRIPTION OF THE DRAWINGS

FIG. 2 illustrates a flow chart of a method 200 for forming a bulk acoustic wave resonance device according to an embodiment of the present disclosure;

FIG. 20($ii$) illustrates a schematic structural view of a tetragonal crystal grain; and FIG. 20($iii$) illustrates a schematic structural view of a cubic crystal grain.

DETAILED DESCRIPTION

Embodiments of the present disclosure are described in detail below in conjunction with accompanying drawings.

In following descriptions, details are set forth in order to provide a thorough understanding of the present disclosure, but the present disclosure may be practiced otherwise than as specifically described herein, and therefore the present disclosure is not limited by the embodiments disclosed below.

Figure 1A:
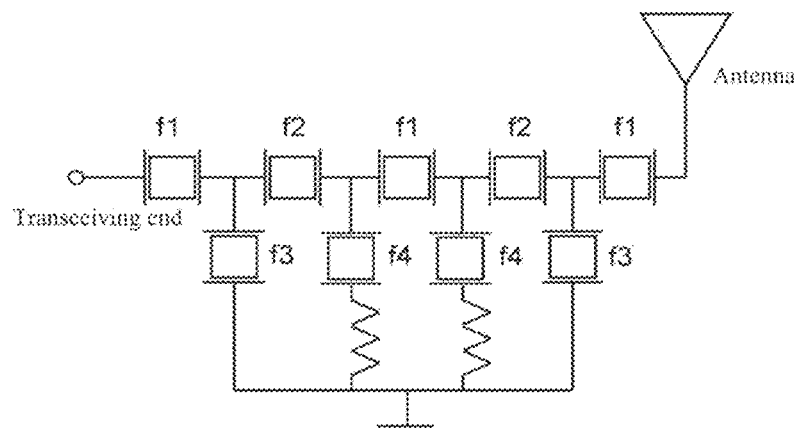
FIG. 1a illustrates a schematic view of a bulk acoustic wave filter circuit.
Figure 1B:
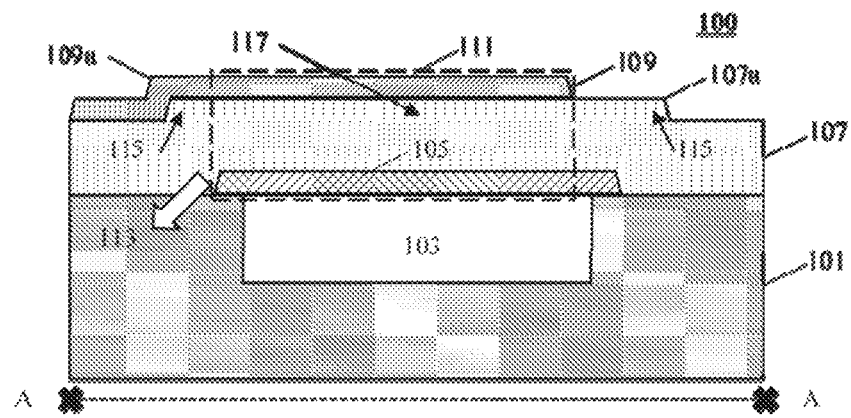
FIG. 1b illustrates a schematic structural view of a cross-section of an FBAR 100.

As described in the background, referring to FIG. 1$b$, the FBAR 100 is formed by stacking layers, including forming the electrode layer 105 on the substrate 101, forming the piezoelectric layer 107 on the electrode layer 105 and the substrate 101, and forming the electrode layer 109 on the piezoelectric layer 107. As the electrode layer 105 protrudes above the substrate 101, forming the piezoelectric layer 107 directly on the electrode layer 105 and the substrate 101 may cause some crystal grains in the piezoelectric layer 107, for example, some crystal grains in both side portions 115 of the convex part 107$a$, to suffer from a significant change to their orientation and to be not parallel to other crystal grains, for example, some crystal grains in a middle portion 117 of the convex part 107$a$, which may cause a decrease in an electromechanical coupling factor and a Q value of the FBAR. In addition, the FBAR 100 formed by stacking layers may not be flexible.

It has been found by the inventor that forming a piezoelectric layer on a flat surface of a first substrate can enable the piezoelectric layer not to include crystal grains which suffer from a significant change to their orientation, to improve an electromechanical coupling factor and a Q value of a resonator device.

It has also been found that a second substrate and active layers (including at least the piezoelectric layer, a lower electrode layer, such as the electrode layer 105 in the FBAR 100, and an upper electrode layer, such as the electrode layer 109 in the FBAR 100) may be processed separately, which allows the forming method of the resonant device to be flexible.

Further, as a material of the first substrate and a material of the piezoelectric layer are lattice-mismatch, the piezoelectric layer includes two sub-piezoelectric layers with different crystal quality. The first sub-piezoelectric layer between the first substrate and the second sub-piezoelectric layer is a transition layer with a relatively low crystal quality, and the second sub-piezoelectric layer is formed on the first sub-piezoelectric layer with relatively high crystal quality. If the first piezoelectric sub-layer is not removed, the electromechanical coupling factor and the Q value of the resonance device may be affected. It should be noted that, referring to FIG. 1$b$, the FBAR 100 is formed by stacking layers, and the piezoelectric layer 107 is directly formed on the electrode layer 105, thus it would be very unlikely to remove the sub-piezoelectric layer with low crystal quality which is in contact with the electrode layer 105.

It has also been found that the first sub-piezoelectric layer with low crystal quality may be further removed after the first substrate is removed, while the second sub-piezoelectric layer with high crystal quality is retained, to further increase the electromechanical coupling factor and the Q value of the resonant device.

It has also been found that the photoetching mark on the piezoelectric layer has a calibration function. During the formation of the edge structure or the second electrode layer, alignment with respect to the photoetching mark improves accuracy.

FIG. 2 illustrates a flow chart of a method 200 for forming a bulk acoustic wave resonance device according to an embodiment of the present disclosure.

As shown in FIG. 2, a method 200 for forming a bulk acoustic wave resonance device is provided in embodiments of the present disclosure, and includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, joining the first stack and the second stack, and the second stack is disposed at the second side of the first stack.

In S207, removing the first substrate, and the first side of the first stack corresponds to a side of the piezoelectric layer.

In S209, forming a second electrode layer at the first side of the first stack, and the second electrode layer is in contact with the piezoelectric layer.

In S211, the cavity pretreatment layer is etched to form the cavity, and the first end of the first electrode layer is disposed in the cavity.

The piezoelectric layer is formed on a flat surface of the first substrate, which enables the piezoelectric layer not to include crystal grains which suffer from a significant change to their orientation, to improve an electromechanical coupling factor and a Q value of the resonator device. In addition, the second substrate and the active layers (including at least the piezoelectric layer, the first electrode layer, and the second electrode layer) may be processed separately, which allows the forming method of the resonant device to be flexible.

In some embodiments, the first substrate is made of one or more materials selected from but not limited to a group consisting of silicon, silicon carbide and glass.

In some embodiments, the piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate.

Figure 19:
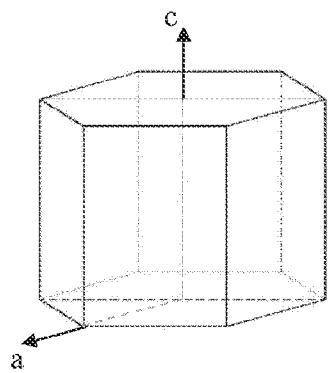
FIG. 19 illustrates a schematic structural view of a hexagonal crystal grain.
Figure 20:
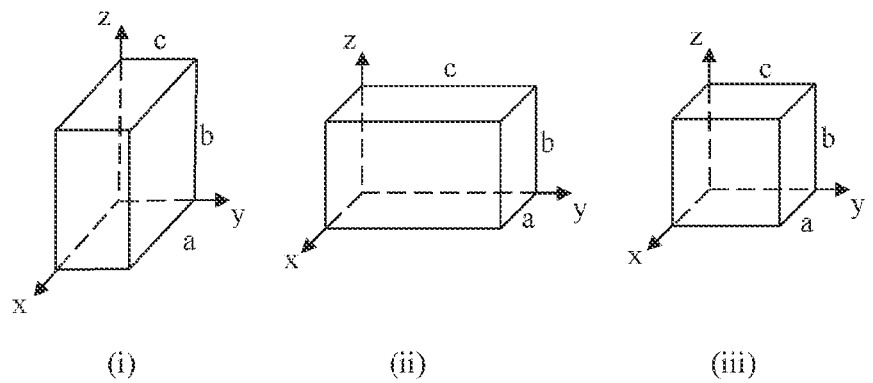
FIG. 20($i$) illustrates a schematic structural view of an orthorhombic crystal grain.

In some embodiments, the piezoelectric layer includes crystal grains. Crystal grains include a first crystal grain and a second crystal grain, and the first crystal grain and the second crystal grain are any two crystal grains of crystal grains. In some embodiments, that crystal grain orientation and crystal plane of a crystal grain can be represented based on a coordinate system. As shown in FIG. 19, a hexagonal crystal grain, such as an aluminum nitride crystal grain, may be represented by an ac stereoscopic coordinate system (including a-axis and c-axis). As shown in FIG. 20, the crystal grains of (i) orthorhombic system ($a \neq b \neq c$), (ii) tetragonal system ($a = b \neq c$), (iii) cubic system ($a = b = c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same orientation or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer includes crystal grains, and a crystal composed of crystal grains has a full width at half maximum of a rocking curve smaller than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent a crystal quality, and the smaller the full width at half maximum of the rocking curve is, the higher the crystal quality is. In addition, the Full Width at Half Maximum (FWHM) refers to an interval between two points whose function values are equal to a half of a peak value the function.

In some embodiments, the second substrate is made of one or more materials selected from but not limited to a group consisting of silicon, silicon carbide and glass.

In some embodiments, the first electrode layer is made of one or more materials selected from but not limited to a group consisting of molybdenum, ruthenium, tungsten, platinum, iridium and aluminum, and the second electrode layer is made of one or more materials selected from but not limited to a group consisting of molybdenum, ruthenium, tungsten, platinum, iridium and aluminum.

In some embodiments, S205 includes joining the cavity pretreatment layer and the second substrate. It should be noted that acoustic impedance of the cavity pretreatment layer may be relatively smaller to that of the piezoelectric layer to reduce leaky waves propagating from the resonance region to the second substrate.

In some embodiments, in S211, an etching method may include but is not limited to oxygen ion etching, hydrofluoric acid etching, and xenon difluoride etching.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

Figure 3A:
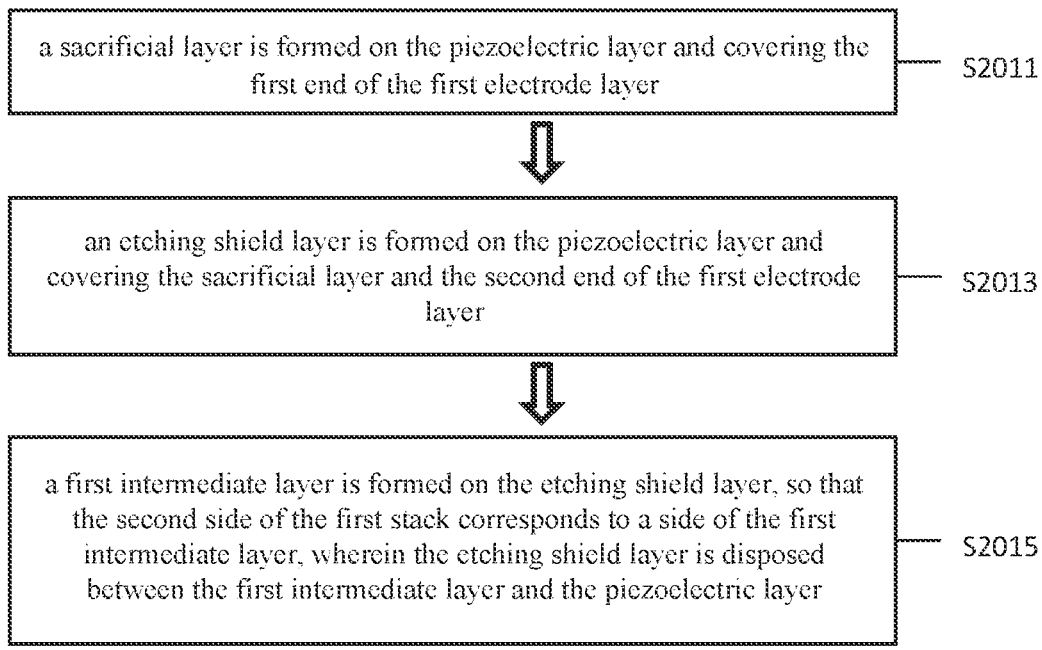
FIG. 3a illustrates a flow chart of a method 300a for forming a cavity pretreatment layer in a method 200 for forming a bulk acoustic wave resonance device according to an embodiment of the present disclosure.

In some embodiments, as shown in FIG. 3a, forming a cavity pretreatment layer in S201 includes S2011, S2013 and S2015.

In S2011, a sacrificial layer is formed on the piezoelectric layer and covering the first end of the first electrode layer.

In S2013, an etching shield layer is formed on the piezoelectric layer and covering the sacrificial layer and the second end of the first electrode layer.

In S2015, a first intermediate layer is formed on the etching shield layer, and the second side of the first stack corresponds to a side of the first intermediate layer, and the etching shield layer is disposed between the first intermediate layer and the piezoelectric layer.

In some embodiments, the sacrificial layer is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the etching shield layer is made of one or more materials selected from but not limited to a group consisting of aluminum nitride, silicon carbide, diamond, silicon nitride, silicon dioxide, aluminum oxide and titanium dioxide. In some embodiments, the etching shield layer has a thickness within a range from 0.1 micrometer to 3 micrometers.

In some embodiments, the first intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide. In some embodiments, a thickness of the first intermediate layer is within but not limited to a range from 0.1 micrometer to 10 micrometers.

In some embodiments. S205 includes joining the first intermediate layer and the second substrate. It should be noted that acoustic impedance of the first intermediate layer may be relatively smaller to that of the piezoelectric layer to reduce leaky waves propagating from the resonance region to the second substrate.

In some embodiments, S211 includes removing the sacrificial layer by etching to form the cavity, and the first end of the first electrode layer is disposed in the cavity. In some embodiments, an etching method may include but is not limited to oxygen ion etching, hydrofluoric acid etching, and xenon difluoride etching.

It should be noted that the etching shield layer may serve to protect the first intermediate layer while forming the cavity by etch. In addition, the etching shield layer may serve to protect the resonance device from being corroded by water or oxygen.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

Figure 3B:
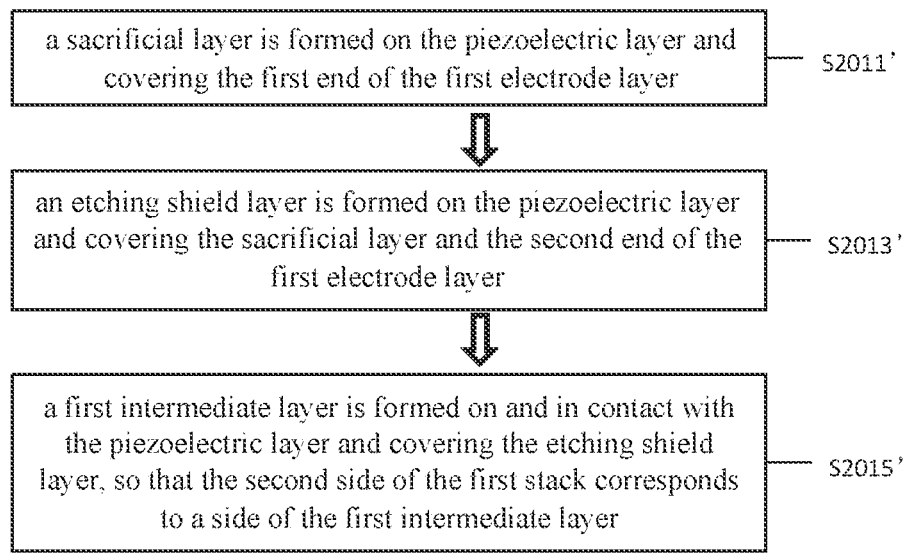
FIG. 3b illustrates a flow chart of a method 300b for forming a cavity pretreatment layer in a method 200 for forming a bulk acoustic wave resonance device according to an embodiment of the present disclosure.

In some embodiments, as shown in FIG. 3b, forming a cavity pretreatment layer in S201 includes S2011', S2013' and S2015'.

In S2011', a sacrificial layer is formed on the piezoelectric layer and covering the first end of the first electrode layer.

In S2013', an etching shield layer is formed on the piezoelectric layer and covering the sacrificial layer and the second end of the first electrode layer.

In S2015', a first intermediate layer is formed on and in contact with the piezoelectric layer and covering the etching shield layer, and the second side of the first stack corresponds to a side of the first intermediate layer.

In some embodiments, the sacrificial layer is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the etching shield layer is made of one or more materials selected from but not limited to a group consisting of aluminum nitride, silicon carbide, diamond, silicon nitride, silicon dioxide, aluminum oxide and titanium dioxide. In some embodiments, the etching shield layer has a thickness within a range from 0.1 micrometer to 3 micrometers.

In some embodiments, the first intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide. In some embodiments, a thickness of the first intermediate layer is within but not limited to a range from 0.1 micrometer to 10 micrometers.

In some embodiments, S205 includes joining the first intermediate layer and the second substrate. It should be noted that acoustic impedance of the first intermediate layer may be relatively smaller to that of the piezoelectric layer to reduce leaky waves propagating from the resonance region to the second substrate.

In some embodiments, S211 includes removing the sacrificial layer by etching to form the cavity, and the first end of the first electrode layer is disposed in the cavity. In some embodiments, an etching method may include but is not limited to oxygen ion etching, hydrofluoric acid etching, and xenon difluoride etching.

It should be noted that the etching shield layer may serve to protect the first intermediate layer while forming the cavity by etch. In addition, the etching shield layer may serve to protect the resonance device from being corroded by water or oxygen.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

Figure 3C:
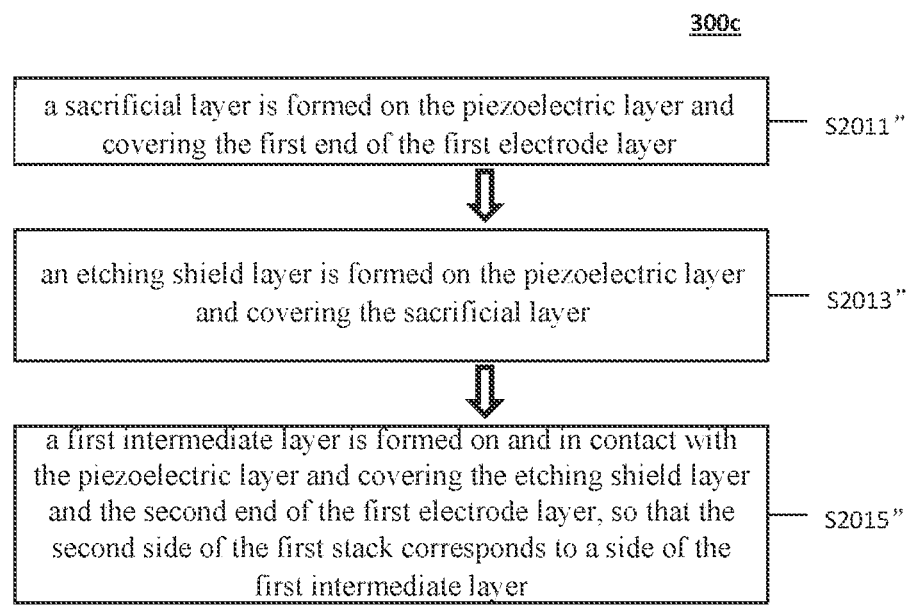
FIG. 3c illustrates a flow chart of a method 300c for forming a cavity pretreatment layer in a method 200 for forming a bulk acoustic wave resonance device according to an embodiment of the present disclosure.

In some embodiments, as shown in FIG. 3c, forming a cavity pretreatment layer in S201 includes S2011", S2013" and S2015".

In S2011', a sacrificial layer is formed on the piezoelectric layer and covering the first end of the first electrode layer.

In S2013", an etching shield layer is formed on the piezoelectric layer and covering the sacrificial layer.

In S2015", a first intermediate layer is formed on and in contact with the piezoelectric layer and covering the etching shield layer and the second end of the first electrode layer, and the second side of the first stack corresponds to a side of the first intermediate layer.

In some embodiments, the sacrificial layer is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the etching shield layer is made of one or more materials selected from but not limited to a group consisting of aluminum nitride, silicon carbide, diamond, silicon nitride, silicon dioxide, aluminum oxide and titanium dioxide. In some embodiments, the etching shield layer has a thickness within a range from 0.1 micrometer to 3 micrometers.

In some embodiments, the first intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide. In some embodiments, a thickness of the first intermediate layer is within but not limited to a range from 0.1 micrometer to 10 micrometers.

In some embodiments, S205 includes joining the first intermediate layer and the second substrate. It should be noted that acoustic impedance of the first intermediate layer may be relatively smaller to that of the piezoelectric layer to reduce leaky waves propagating from the resonance region to the second substrate.

In some embodiments, S211 includes removing the sacrificial layer by etching to form the cavity, and the first end of the first electrode layer is disposed in the cavity. In some embodiments, an etching method may include but is not limited to oxygen ion etching, hydrofluoric acid etching, and xenon difluoride etching.

It should be noted that the etching shield layer may serve to protect the first intermediate layer while forming the cavity by etch. In addition, the etching shield layer may serve to protect the resonance device from being corroded by water or oxygen.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

Figure 4:
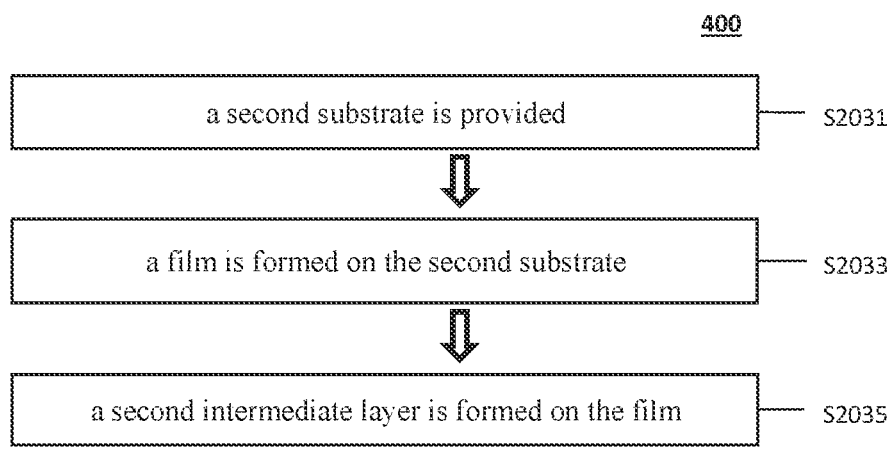
FIG. 4 illustrates a flow chart of a method 400 for forming a second stack in a method 200 for forming a bulk acoustic wave resonance device according to an embodiment of the present disclosure.

In some embodiments, as shown in FIG. 4, S203 includes S2031, S2033 and S2035.

In S2031, a second substrate is provided.

In S2033, a film is formed on the second substrate.

In S2035, a second intermediate layer is formed on the film.

In some embodiments, the film includes but is not limited to a polycrystalline film. In some embodiments, the polycrystalline film is made of one or more materials selected from but not limited to a group consisting of polysilicon, polycrystalline silicon nitride, and polycrystalline silicon carbide. It should be noted that the film (for example, a trap rich layer) between the second substrate and the second intermediate layer helps to prevent formation of a free electron layer on the surface of the second substrate, to reduce an electric loss caused by the second substrate.

In some embodiments, the second intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

In some embodiments, S205 includes joining the cavity pretreatment layer and the second substrate to form a third intermediate layer. In some embodiments, a thickness of the third intermediate layer is within but not limited to a range from 0.1 micrometer to 10 micrometers. It should be noted that acoustic impedance of the third intermediate layer may be relatively smaller to that of the piezoelectric layer to reduce leaky waves propagating from the resonance region to the second substrate.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

In some embodiments, forming a cavity pretreatment layer in S201 includes:
  forming a sacrificial layer on the piezoelectric layer and covering the first end of the first electrode layer; and
  forming a first intermediate layer on and in contact with the piezoelectric layer and covering the sacrificial layer and the second end of the first electrode layer, and the second side of the first stack corresponds to a side of the first intermediate layer.

In some embodiments, the sacrificial layer is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the first intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

In some embodiments, S203 further includes forming a second intermediate layer on the second substrate.

In some embodiments, the second intermediate layer is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

In some embodiments, S205 includes bonding the first intermediate layer and the second intermediate layer to form a third intermediate layer. In some embodiments, a thickness of the third intermediate layer is within a range from 0.1 micrometer to 10 micrometers. It should be noted that acoustic impedance of the third intermediate layer may be relatively smaller to that of the piezoelectric layer to reduce leaky waves propagating from the resonance region to the second substrate.

In some embodiments, S211 includes removing the sacrificial layer by etching to form the cavity, and the first end of the first electrode layer is disposed in the cavity. In some embodiments, an etching method may include but is not limited to oxygen ion etching, hydrofluoric acid etching, and xenon difluoride etching.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

In some embodiments, forming a piezoelectric layer in S201 includes: forming a first sub-piezoelectric layer on the first substrate; and forming a second sub-piezoelectric layer on the first sub-piezoelectric layer.

In some embodiments, a full width at half maximum of a rocking curve of the first sub-piezoelectric layer is greater than 1.7 degrees, and a full width at half maximum of a rocking curve of the second sub-piezoelectric layer is smaller than 1.7 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent a crystal quality, and the smaller the full width at half maximum of the rocking curve is, the higher the crystal quality is. That is, a full width at half maximum of a rocking curve being smaller than 1.7 degrees represents a relatively high crystal quality, while a full width at half maximum of a rocking curve being greater than 1.7 degrees represents a relatively low crystal quality. In addition, the Full Width at Half Maximum (FWHM) refers to an interval between two points whose function values are equal to a half of a peak value of the function.

In some embodiments, the first sub-piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the second sub-piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the first sub-piezoelectric layer and the second sub-piezoelectric layer may be made of the same material. In some embodiments, the first sub-piezoelectric layer and the second sub-piezoelectric layer may be made of different materials.

In some embodiments, the second sub-piezoelectric layer includes crystal grains. Crystal grains include a first crystal grain and a second crystal grain, and the first crystal grain and the second crystal grain are any two crystal grains of crystal grains. In some embodiments, the crystal grain orientation and crystal plane of a crystal grain can be represented based on a coordinate system. As shown in FIG. 19, a hexagonal crystal grain, such as an aluminum nitride crystal grain, may be represented by an ac stereoscopic coordinate system (including a-axis and c-axis). As shown in FIG. 20, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same orientation or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the method 200 further includes: removing the first sub-piezoelectric layer following S207, and the first side of the first stack corresponds to a side of the second sub-piezoelectric layer.

In some embodiments, S209 includes: forming the second electrode layer in contact with the second sub-piezoelectric layer.

It should be noted that as a material of the first substrate and a material of the piezoelectric layer are lattice-mismatch, the piezoelectric layer includes two sub-piezoelectric layers with different crystal quality. The first sub-piezoelectric layer between the first substrate and the second sub-piezoelectric layer is a transition layer with a relatively low crystal quality, and the second sub-piezoelectric layer is formed on the first sub-piezoelectric layer with relatively high crystal quality. In some embodiments, after the first substrate is removed, the first sub-piezoelectric layer with low crystal quality is removed, and the second sub-piezoelectric layer with high crystal quality is retained, to further improve the electromechanical coupling factor and the Q value of the resonance device.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

In some embodiments, S201 further includes: forming a photoetching mark prior to forming the piezoelectric layer. In some embodiments, forming a photoetching mark includes: forming an opening at an end of the first substrate; and forming the photoetching mark in the opening.

In some embodiments, the photoetching mark is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the photoetching mark and the piezoelectric layer may be made of the same material. In some embodiments, the photoetching mark and the piezoelectric layer may be made of different materials.

In some embodiments, S207 further includes: retaining the photoetching mark at an end of the piezoelectric layer, and the retained photoetching mark is disposed at the first side of the first stack and in contact with the piezoelectric layer.

In some embodiments, S209 includes: forming the second electrode layer based on the photoetching mark.

It should be noted that the photoetching mark has a calibration function. During the formation of the second electrode layer, alignment with respect to the photoetching mark improves accuracy.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

In some embodiments, S201 further includes: forming a photoetching mark prior to forming the piezoelectric layer. In some embodiments, forming a photoetching mark includes: forming an opening at an end of the first substrate; and forming the photoetching mark in the opening.

In some embodiments, the photoetching mark is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate.

In some embodiments, forming a piezoelectric layer in S201 includes: forming a first sub-piezoelectric layer on the first substrate and the photoetching mark; and forming a second sub-piezoelectric layer on the first sub-piezoelectric layer.

In some embodiments, a full width at half maximum of a rocking curve of the first sub-piezoelectric layer is greater than 1.7 degrees, and a full width at half maximum of a rocking curve of the second sub-piezoelectric layer is smaller than 1.7 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent a crystal quality, and the smaller the full width at half maximum of the rocking curve is, the higher the crystal quality is. That is, a full width at half maximum of a rocking curve being smaller than 1.7 degrees represents a relatively high crystal quality, while a full width at half maximum of a rocking curve being greater than 1.7 degrees represents a relatively low crystal quality. In addition, the Full Width at Half Maximum (FWHM) refers to an interval between two points whose function values are equal to a half of a peak value of the function.

In some embodiments, the first sub-piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the second sub-piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate.

In some embodiments, the first sub-piezoelectric layer and the second sub-piezoelectric layer may be made of the same material. In some embodiments, the first sub-piezoelectric layer and the second sub-piezoelectric layer may be made of different materials. In some embodiments, the photoetching mark and the first sub-piezoelectric layer may be made of the same material. In some embodiments, the photoetching mark and the first sub-piezoelectric layer may be made of different materials.

In some embodiments, the second sub-piezoelectric layer includes crystal grains. Crystal grains include a first crystal grain and a second crystal grain, and the first crystal grain and the second crystal grain are any two crystal grains of crystal grains. In some embodiments, crystal grain orientation and crystal plane of a crystal grain can be represented based on a coordinate system. As shown in FIG. 19, a hexagonal crystal grain, such as an aluminum nitride crystal grain, may be represented by an ac stereoscopic coordinate system (including a-axis and c-axis). As shown in FIG. 20, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same orientation or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the method 200 further includes: removing the first sub-piezoelectric layer following S207, and the first side of the first stack corresponds to a side of the second sub-piezoelectric layer; retaining the photoetching mark at an end of the second sub-piezoelectric layer, and the retained photoetching mark is disposed at the first side of the first stack and in contact with the second sub-piezoelectric layer.

In some embodiments, S209 includes: forming the second electrode layer in contact with the second sub-piezoelectric layer based on the photoetching mark.

It should be noted that as a material of the first substrate and a material of the piezoelectric layer are lattice-mismatch, the piezoelectric layer includes two sub-piezoelectric layers with different crystal quality. The first sub-piezoelectric layer between the first substrate and the second sub-piezoelectric layer is a transition layer with a relatively low crystal quality, and the second sub-piezoelectric layer is formed on the first sub-piezoelectric layer with relatively high crystal quality. In some embodiments, after the first substrate is removed, the first sub-piezoelectric layer with low crystal quality is removed, and the second sub-piezoelectric layer with high crystal quality is retained, to further improve the electromechanical coupling factor and the Q value of the resonance device.

It should be noted that the photoetching mark has a calibration function. During the formation of the second electrode layer, alignment with respect to the photoetching mark improves accuracy.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

In some embodiments, the method 200 further includes: forming an edge structure at the first side of the first stack and in contact with the piezoelectric layer prior to S209. In some embodiments, the edge structure is a ring structure.

In some embodiments, forming an edge structure includes: forming a metal edge structure at the first side of the first stack and in contact with the piezoelectric layer. In some embodiments, forming an edge structure includes: forming a polymer edge structure at the first side of the first stack and in contact with the piezoelectric layer; and forming a metal edge structure on the polymer edge structure.

In some embodiments, forming the edge structure further includes: etching an inner side of the metal edge structure (i.e., an inner side of the edge structure) to form a slope. In some embodiments, an etching angle for etching the inner side of the metal edge structure is within a range from 1 degree to 89 degrees.

In some embodiments, S209 includes: forming the second electrode layer at an inner side of the edge structure.

It should be noted that the edge structure is disposed outside an edge of the second electrode layer, and forms a surrounding edge to the second electrode layer, to restrain a leakage of transverse waves, which may increase the Q value of the resonance device. In addition, the edge structure is disposed within the resonance region which at least includes the piezoelectric layer, the first electrode layer, the edge structure and the second electrode layer. In addition, the slope is formed at the inner side of the edge structure, and an outer side of the edge structure keeps upright, which may increase impedance of the edge structure, to better restrain a leakage of transverse waves.

In some embodiments of the present disclosure, the method 200 for forming the bulk acoustic wave resonance device includes S201 to S211.

In S201, a first stack is formed, and forming the first stack includes: providing a first substrate; forming a piezoelectric layer on the first substrate; forming a first electrode layer on the piezoelectric layer; and forming a cavity pretreatment layer on the piezoelectric layer, and a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, and a first side of the first stack corresponds to a side of the first substrate, and a second side of the first stack corresponds to a side of the cavity pretreatment layer.

In S203, a second stack is formed, and forming the second stack includes providing a second substrate.

In S205, the first stack and the second stack are joined, and the second stack is disposed at the second side of the first stack.

In S207, the first substrate is removed, and the first side of the first stack corresponds to a side of the piezoelectric layer.

In S209, a second electrode layer is formed at the first side of the first stack, and the second electrode layer is in contact with the piezoelectric layer.

In S211, the cavity pretreatment layer is etched to form the cavity, and the first end of the first electrode layer is disposed in the cavity.

In some embodiments, S201 further includes: forming a photoetching mark prior to forming the piezoelectric layer. In some embodiments, forming a photoetching mark includes: forming an opening at an end of the first substrate; and forming the photoetching mark in the opening.

In some embodiments, the photoetching mark is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the piezoelectric layer is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the photoetching mark and the piezoelectric layer may be made of the same material. In some embodiments, the photoetching mark and the piezoelectric layer may be made of different materials.

In some embodiments, S207 further includes: retaining the photoetching mark at an end of the piezoelectric layer, and the retained photoetching mark is disposed at the first side of the first stack and in contact with the piezoelectric layer.

In some embodiments, the method 200 further includes: forming an edge structure at the first side of the first stack and in contact with the piezoelectric layer based on the photoetching mark prior to S209. In some embodiments, the edge structure is a ring structure.

In some embodiments, forming an edge structure includes: forming a metal edge structure at the first side of the first stack and in contact with the piezoelectric layer based on the photoetching mark. In some embodiments, forming an edge structure includes, forming a polymer edge structure at the first side of the first stack and in contact with the piezoelectric layer based on the photoetching mark; and forming a metal edge structure on the polymer edge structure.

In some embodiments, forming the edge structure further includes: etching an inner side of the metal edge structure (i.e., an inner side of the edge structure) to form a slope. In some embodiments, an etching angle for etching the inner side of the metal edge structure is within a range from 1 degree to 89 degrees.

In some embodiments, S209 includes: forming the second electrode layer at an inner side of the edge structure based on the photoetching mark.

It should be noted that the photoetching mark has a calibration function. During the formation of the edge structure and the second electrode layer, alignment with respect to the photoetching mark improves accuracy.

In addition, the edge structure is disposed outside an edge of the second electrode layer, and forms a surrounding edge to the second electrode layer, to restrain a leakage of transverse waves, which may increase the Q value of the resonance device. In addition, the edge structure is disposed within the resonance region which at least includes the piezoelectric layer, the first electrode layer, the edge structure and the second electrode layer. In addition, the slope is formed at the inner side of the edge structure, and an outer side of the edge structure keeps upright, which may increase impedance of the edge structure, to better restrain a leakage of transverse waves.

In conjunction with schematic structural views of cross-sections of a bulk acoustic wave resonance device, embodiments of the present disclosure provide following methods for forming a bulk acoustic wave resonance device to facilitate understanding the present disclosure. The present disclosure may also be implemented using other solutions different from the embodiments below. Therefore, the present disclosure is not limited by the embodiments disclosed below.

FIGS. 5 to 10 illustrate schematic structural views of a cross-section A in a method for forming a bulk acoustic wave resonance device according to an embodiment of the present disclosure.

Figure 5:
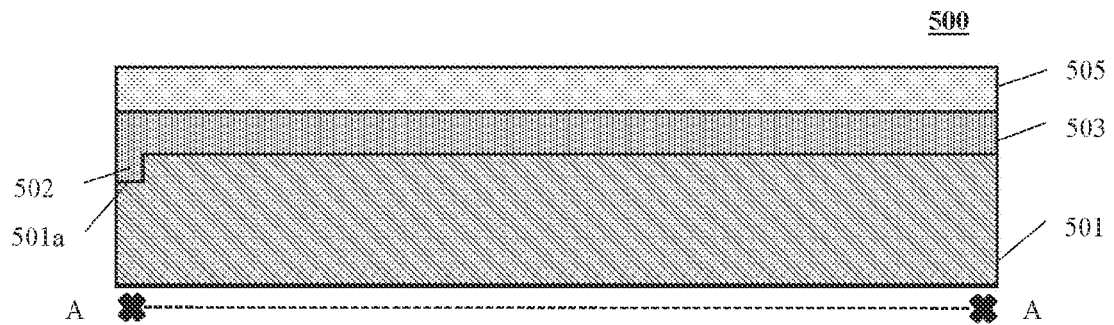
FIGS. 5 to 10 illustrate schematic structural views of cross-sections in a method for forming a bulk acoustic wave resonance device according to an embodiment of the present disclosure.

As shown in FIG. 5, the method includes: forming a first stack, and forming the first stack includes:
 providing a substrate 501;
 forming an opening 501a at an end of the substrate 501;
 forming a photoetching mark 502 in the opening 501a;
 forming a sub-piezoelectric layer 503 on the substrate 501 and the photoetching mark 502;
 forming a sub-piezoelectric layer 505 on the sub-piezoelectric layer 503.

In some embodiments, the substrate 501 is made of one or more materials selected from but not limited to a group consisting of silicon, silicon carbide and glass.

In some embodiments, the photoetching mark 502 is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the sub-piezoelectric layer 503 is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the photoetching mark 502 and the sub-piezoelectric layer 503 may be made of the same material. In some embodiments, the photoetching mark 502 and the sub-piezoelectric layer 503 may be made of different materials.

In some embodiments, the sub-piezoelectric layer 505 is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the sub-piezoelectric layer 503 and the sub-piezoelectric layer 505 may be made of the same material. In some embodiments, the sub-piezoelectric layer 503 and the sub-piezoelectric layer 505 may be made of different materials.

In some embodiments, a full width at half maximum of a rocking curve of the sub-piezoelectric layer 503 is greater than 1.7 degrees, and a full width at half maximum of a rocking curve of the second sub-piezoelectric layer 505 is smaller than 1.7 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent a crystal quality, and the smaller the full width at half maximum of the rocking curve is, the higher the crystal quality is. That is, a full width at half maximum of a rocking curve being smaller than 1.7 degrees represents a relatively high crystal quality, while a full width at half maximum of a rocking curve being greater than 1.7 degrees represents a relatively low crystal quality. In addition, the Full Width at Half Maximum (FWHM) refers to an interval between two points whose function values are equal to a half of a peak value of the function.

It should be noted that as a material of the substrate 501 and a material of the piezoelectric layer are lattice-mismatch, the piezoelectric layer includes two sub-piezoelectric layers with different crystal quality. The sub-piezoelectric layer 503 between the substrate 501 and the sub-piezoelectric layer 505 is a transition layer with a relatively low crystal quality, and the sub-piezoelectric layer 503 is formed on the sub-piezoelectric layer 503 with relatively high crystal quality.

In some embodiments, the sub-piezoelectric layer 505 includes crystal grains. Crystal grains include a first crystal grain and a second crystal grain, and the first crystal grain and the second crystal grain are any two crystal grains of crystal grains. In some embodiments, the crystal grain orientation and crystal plane of a crystal grain can be represented based on a coordinate system. As shown in FIG. 19, a hexagonal crystal grain, such as an aluminum nitride crystal grain, may be represented by an ac stereoscopic coordinate system (including a-axis and c-axis). As shown in FIG. 20, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same orientation or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

Figure 6:
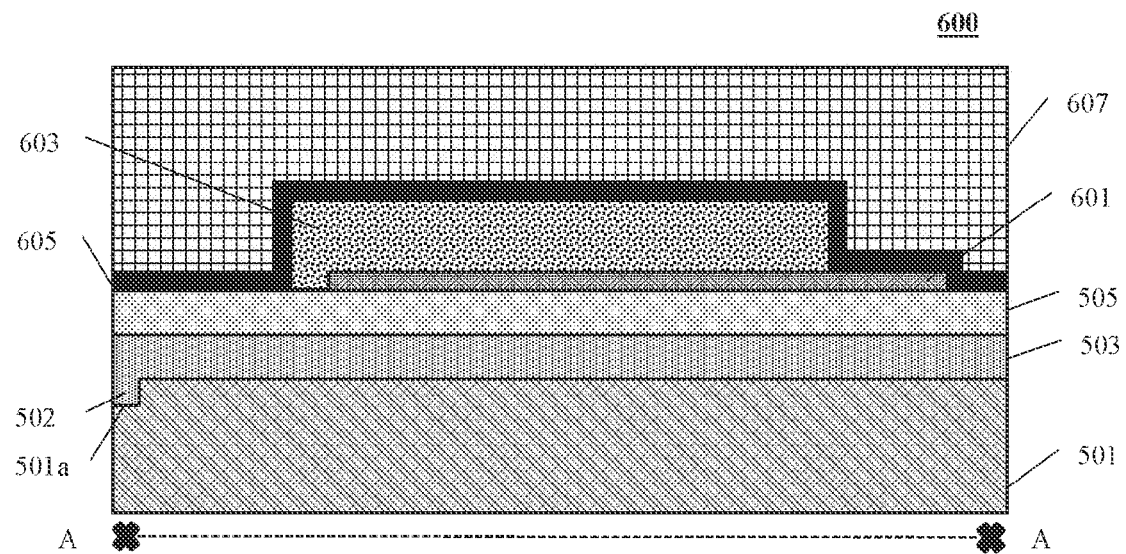

In some embodiments, referring to FIG. 6, forming the first stack includes:
- forming an electrode layer 601 on the sub-piezoelectric layer 505, and the electrode layer 601 is disposed at a first side of the sub-piezoelectric layer 505;
- forming a sacrificial layer 603 on the sub-piezoelectric layer 505 and covering a first end of the electrode layer 601.
- forming an etching shield layer 605 on the sub-piezoelectric layer 505 and covering the sacrificial layer 603 and a second end of the electrode layer 601.
- forming an intermediate layer 607 on the etching shield layer 605, and the etching shield layer 605 is disposed between the intermediate layer 607 and the sub-piezoelectric layer 505.

In some embodiments, the electrode layer 601 is made of one or more materials selected from but not limited to a group consisting of molybdenum, ruthenium, tungsten, platinum, iridium and aluminum.

In some embodiments, the sacrificial layer 603 is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the etching shield layer 605 is made of one or more materials selected from but not limited to a group consisting of aluminum nitride, silicon carbide, diamond, silicon nitride, silicon dioxide, aluminum oxide and titanium dioxide. In some embodiments, the etching shield layer has a thickness within a range from 0.1 micrometer to 3 micrometers.

In some embodiments, the intermediate layer 607 is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

Figure 7:
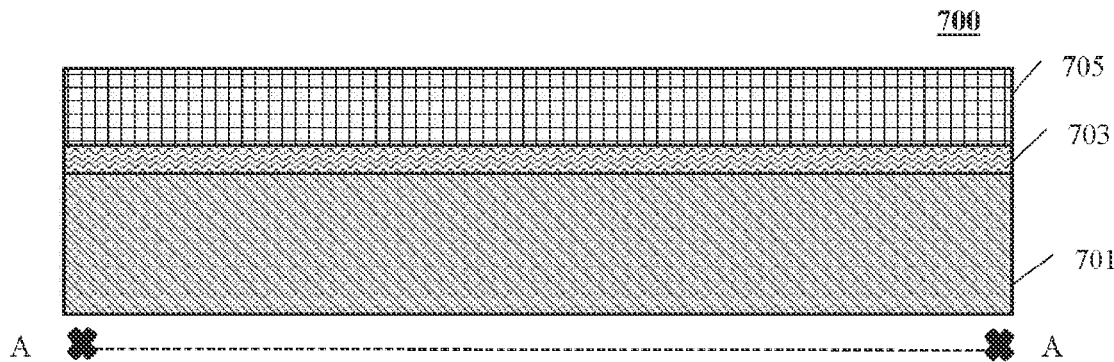

In some embodiments, referring to FIG. 7, the method further includes forming a second stack, and forming the second stack includes:
   forming a substrate 701;
   forming a film 703 on the substrate 701; and
   forming an intermediate layer 705 on the film 703.

In some embodiments, the substrate 701 is made of one or more materials selected from but not limited to a group consisting of silicon, silicon carbide and glass.

In some embodiments, the film 703 includes but is not limited to a polycrystalline film. In some embodiments, the polycrystalline film is made of one or more materials selected from but not limited to a group consisting of polysilicon, polycrystalline silicon nitride, and polycrystalline silicon carbide. It should be noted that the film 703 between the substrate 701 and the intermediate layer 705 helps to prevent formation of a free electron layer on the surface of the substrate 701, to reduce an electric loss caused by the substrate 701.

In some embodiments, the intermediate layer 705 is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

Figure 8:
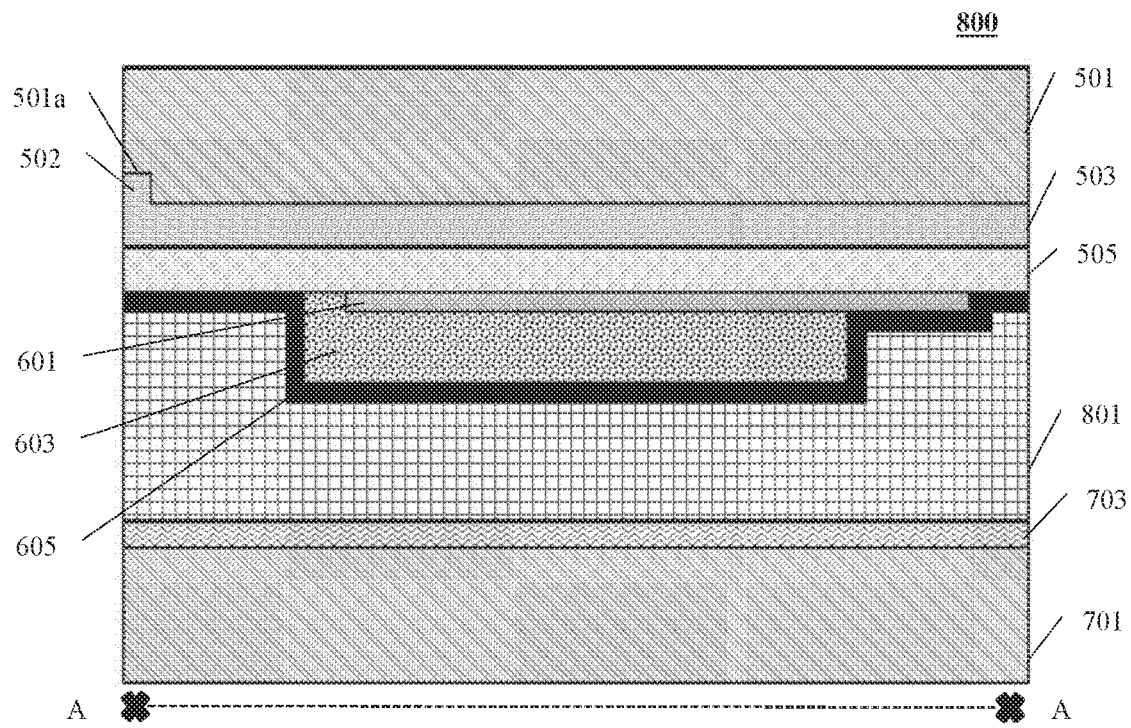

In some embodiments, referring to FIG. 8, the method further includes:
   bonding the intermediate layer 607 and the intermediate layer 705 to form an intermediate layer 801.

In some embodiments, a thickness of the intermediate layer 801 is within but not limited to a range from 0.1 micrometer to 10 micrometers. It should be noted that acoustic impedance of the intermediate layer 801 may be relatively smaller to that of the sub-piezoelectric layer 505 to reduce leaky waves propagating from the resonance region to the substrate 701.

In some embodiments, the intermediate layer 607 and the intermediate layer 705 are wafer bonded to form the intermediate layer 801. In some embodiments, the wafer bonding adopts but is not limited to one of polymer bonding technology and insulating dielectric bonding technology. In some embodiments, the polymer bonding technology includes; coating a polymer on a wafer; drying the polymer after the polymer is completely flat; and bonding the wafer. In some embodiments, the insulating dielectric bonding technology includes: forming an insulating dielectric layer on a wafer; planarizing the insulating dielectric layer; and bonding the wafer.

Figure 9:
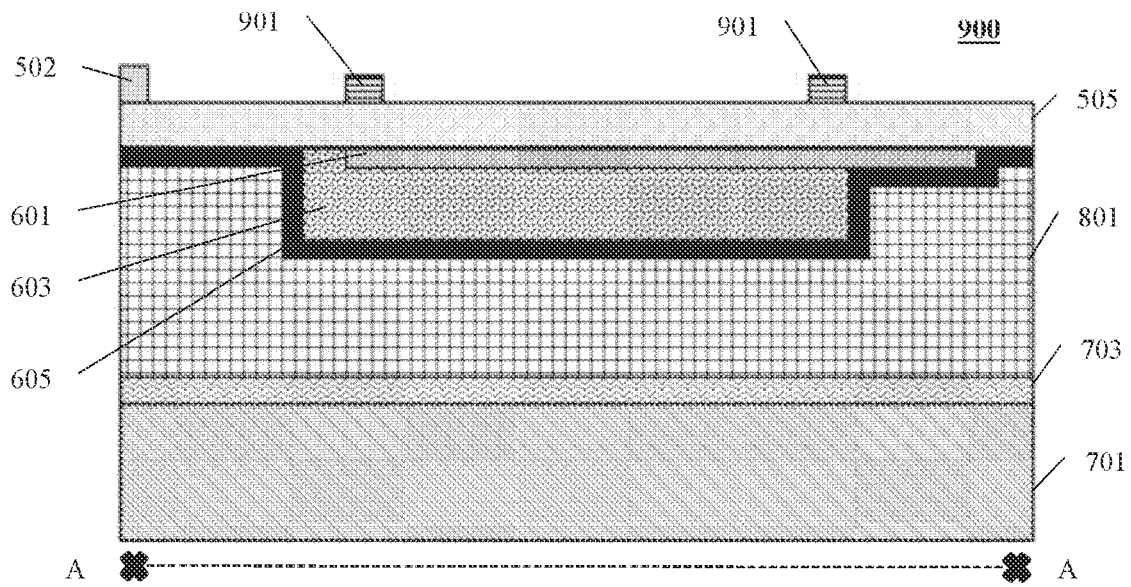

In some embodiments, referring to FIG. 9, the method further includes:
   removing the substrate 501;
   removing the sub-piezoelectric layer 503, retaining the photoetching mark 502 at an end of the sub-piezoelectric layer 505, and the retained photoetching mark 502 is disposed at a second side of the sub-piezoelectric layer 505 which is opposite to the first side of the sub-piezoelectric layer 505; and
   forming an edge structure 901 at the second side of the sub-piezoelectric layer 505 and in contact with the sub-piezoelectric layer 505 based on the photoetching mark 502.

In some embodiments, the edge structure 901 is a ring structure.

In some embodiments, forming the edge structure 901 includes: forming a metal edge structure at the second side of the sub-piezoelectric layer 505 and in contact with the sub-piezoelectric layer 505 based on the photoetching mark 502. In some embodiments, forming the edge structure 901 includes: forming a polymer edge structure at the second side of the sub-piezoelectric layer 505 and in contact with the sub-piezoelectric layer 505 based on the photoetching mark 502; and forming a metal edge structure on the polymer edge structure.

In some embodiments, forming the edge structure 901 further includes: etching an inner side of the metal edge structure (i.e., an inner side of the edge structure 901) to form a slope. In some embodiments, an etching angle for etching the inner side of the metal edge structure is within a range from 1 degree to 89 degrees.

It should be noted that the sub-piezoelectric layer 503 is further removed after the substrate 501 is removed, while the sub-piezoelectric layer 505 with high crystal quality is retained, to further increase the electromechanical coupling factor and the Q value of the resonant device.

Figure 10:
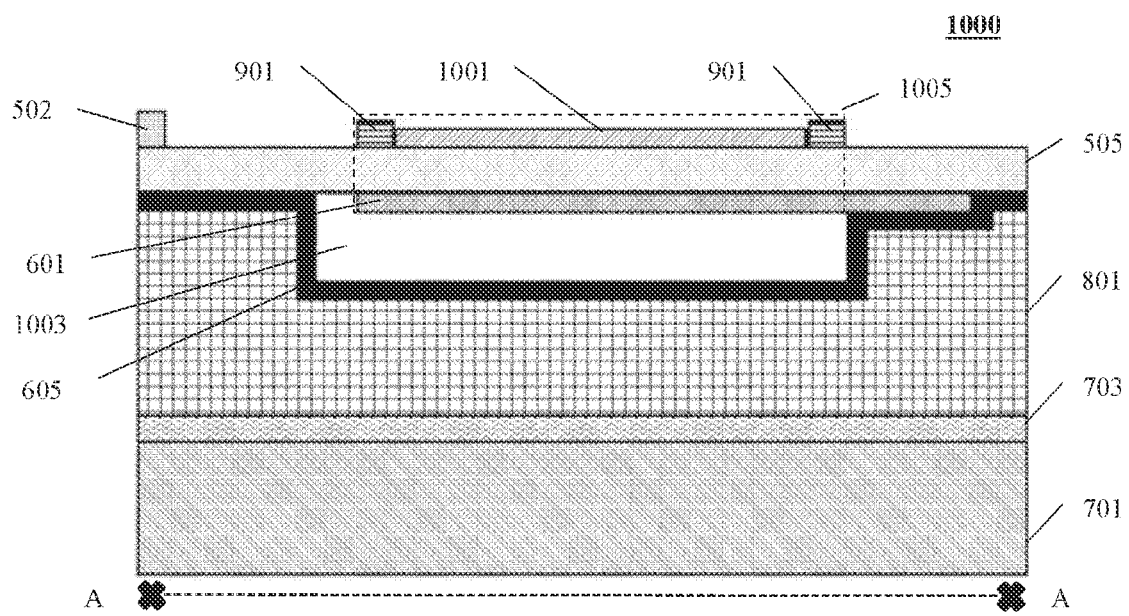

In some embodiments, referring to FIG. 10, the method further includes:
   forming an electrode layer 1001 at the second side of the sub-piezoelectric layer 505 and in contact with the sub-piezoelectric layer 505 based on the photoetching mark 502. The electrode layer 1001 is disposed at an inner side of the edge structure 901; and
   removing the sacrificial layer 603 by etching to form the cavity 1003, and the first end of the electrode layer 601 is disposed in the cavity 1003.

In some embodiments, the electrode layer 1001 is made of one or more materials selected from but not limited to a group consisting of molybdenum, ruthenium, tungsten, platinum, iridium and aluminum.

In some embodiments, an etching method may include but is not limited to oxygen ion etching, hydrofluoric acid etching, and xenon difluoride etching.

It should be noted that the photoetching mark 502 has a calibration function. During the formation of the edge structure 901 and the electrode layer 1001, alignment with respect to the photoetching mark 502 improves accuracy.

In addition, the edge structure 901 is disposed outside an edge of the electrode layer 1001, and forms a surrounding edge to the electrode layer 1001, to restrain a leakage of transverse waves, which may increase the Q value of the resonance device.

In addition, the edge structure 901 is disposed within the resonance region 1005 which at least includes the sub-piezoelectric layer 505, the electrode layer 601, the edge structure 901 and the electrode layer 1001. The resonance region 1005 is suspended relative to the cavity 1003, and does not overlap with the intermediate layer 801.

In addition, a slope is formed at the inner side of the edge structure 901, and an outer side of the edge structure keeps upright, which may increase impedance of the edge structure 901, to better restrain a leakage of transverse waves.

In addition, the etching shield layer 605 may serve to protect the intermediate layer 801 when the sacrificial layer 603 is removed to form the cavity 1003. In addition, the etching shield layer 605 may serve to protect the resonance device from being corroded by water or oxygen.

First, the sub-piezoelectric layer 503 and the sub-piezoelectric layer 505 are formed on a flat surface of the substrate 501, which enables the sub-piezoelectric layer 505 not to include crystal grains which suffer from a significant change to their orientation, to improve an electromechanical coupling factor and a Q value of the resonator device.

Second, the substrate 701 and the active layers (including at least the sub-piezoelectric layer 505, the electrode layer 601, the edge structure 901, and the electrode layer 1001) may be processed separately, which allows the forming method of the resonant device to be flexible.

Third, acoustic impedance of the intermediate layer 801 may be relatively smaller to that of the sub-piezoelectric layer 505 to reduce leaky waves propagating from the resonance region to the substrate 701.

Fourth, the film 703 between the substrate 701 and the intermediate layer 801 helps to prevent formation of a free electron layer on the surface of the substrate 701, to reduce an electric loss caused by the substrate 701.

Fifth, the sub-piezoelectric layer 503 with low crystal quality may be further removed after the substrate 501 is removed, while the sub-piezoelectric layer 505 with high crystal quality is retained, to further increase the electromechanical coupling factor and the Q value of the resonant device.

Sixth, the photoetching mark 502 has a calibration function. During the formation of the edge structure 901 and the electrode layer 1001, alignment with respect to the photoetching mark 502 improves accuracy.

FIGS. 11 to 14 illustrate schematic structural views of a cross-section A in a method for forming a bulk acoustic wave resonance device according to an embodiment of the present disclosure.

Figure 11:
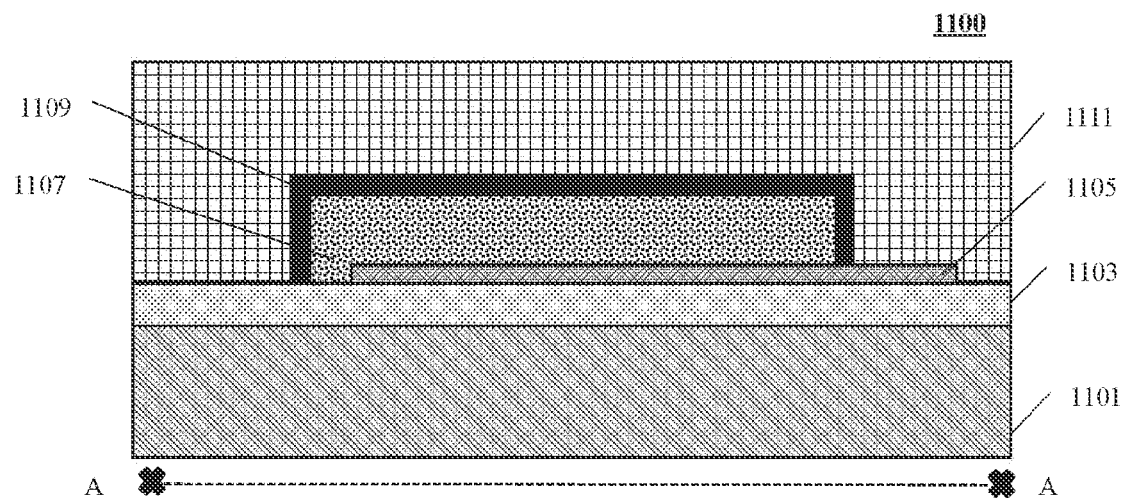
FIGS. 11 to 14 illustrate schematic structural views of cross-sections in a method for forming a bulk acoustic wave resonance device according to an embodiment of the present disclosure.

As shown in FIG. 11, the method includes: forming a first stack, and forming the first stack includes:
   providing a substrate 1101;
   forming a piezoelectric layer 1103 on the substrate 1101;
   forming an electrode layer 1105 on the piezoelectric layer 1103, and the electrode layer 1105 is disposed at a first side of the piezoelectric layer 1103;
   forming a sacrificial layer 1107 on the piezoelectric layer 1103 and covering a first end of the electrode layer 1105.
   forming an etching shield layer 1109 on the piezoelectric layer 1103 and covering the sacrificial layer 1107; and
   forming an intermediate layer 1111 disposed on and in contact with the piezoelectric layer 1103 and covering the etching shield layer 1109 and a second end of the electrode layer 1105.

In some embodiments, the substrate 1101 is made of one or more materials selected from but not limited to a group consisting of silicon, silicon carbide and glass.

In some embodiments, the piezoelectric layer 1103 is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1103 includes crystal grains. The plurality of crystal grains include a first crystal grain and a second crystal grain, and the first crystal grain and the second crystal grain are any two crystal grains of crystal grains. In some embodiment, crystal grain orientation and crystal plane of a crystal grain can be represented based on a coordinate system. As shown in FIG. 19, a hexagonal crystal grain, such as an aluminum nitride crystal grain, may be represented by an ac stereoscopic coordinate system (including a-axis and c-axis). As shown in FIG. 20, the crystal grains of (i) orthorhombic system (a≠b≠c). (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same orientation or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1103 includes crystal grains, and a crystal composed of crystal grains has a full width at half maximum of a rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve represents a crystal quality, and the smaller the full width at half maximum of the rocking curve is, the higher the crystal quality is. In addition, the Full Width at Half Maximum (FWHM) refers to an interval between two points whose function values are equal to a half of a peak value of the function.

In some embodiments, the electrode layer 1105 is made of one or more materials selected from but not limited to a group consisting of molybdenum, ruthenium, tungsten, platinum, iridium and aluminum.

In some embodiments, the sacrificial layer 1107 is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the etching shield layer 1109 is made of one or more materials selected from but not limited to a group consisting of aluminum nitride, silicon carbide, diamond, silicon nitride, silicon dioxide, aluminum oxide and titanium dioxide. In some embodiments, the etching shield layer has a thickness within a range from 0.1 micrometer to 3 micrometers.

In some embodiments, the intermediate layer 1111 is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

The piezoelectric layer 1103 is formed on a flat surface of the substrate 1101, which enables the piezoelectric layer 1103 not to include crystal grains which suffer from a significant change to their orientation, to improve an electromechanical coupling factor and a Q value of the resonator device. In addition, the second substrate and the active layers (including at least the piezoelectric layer, the first electrode layer, and the second electrode layer) may be processed separately, which allows the forming method of the resonant device to be flexible.

Figure 12:
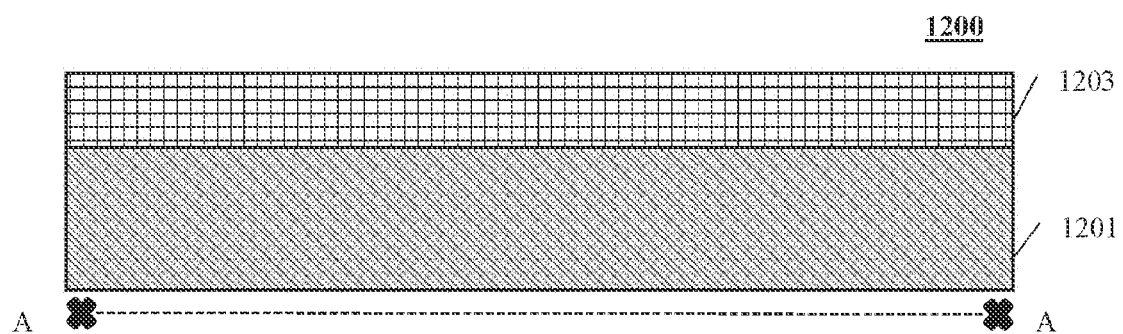

In some embodiments, referring to FIG. 12, the method further includes forming a second stack, and forming the second stack includes:

forming a substrate 1201; and
forming an intermediate layer 1203 on the substrate 1201.

In some embodiments, the substrate 1201 is made of one or more materials selected from but not limited to a group consisting of silicon, silicon carbide and glass.

In some embodiments, the intermediate layer 1203 is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

Figure 13:
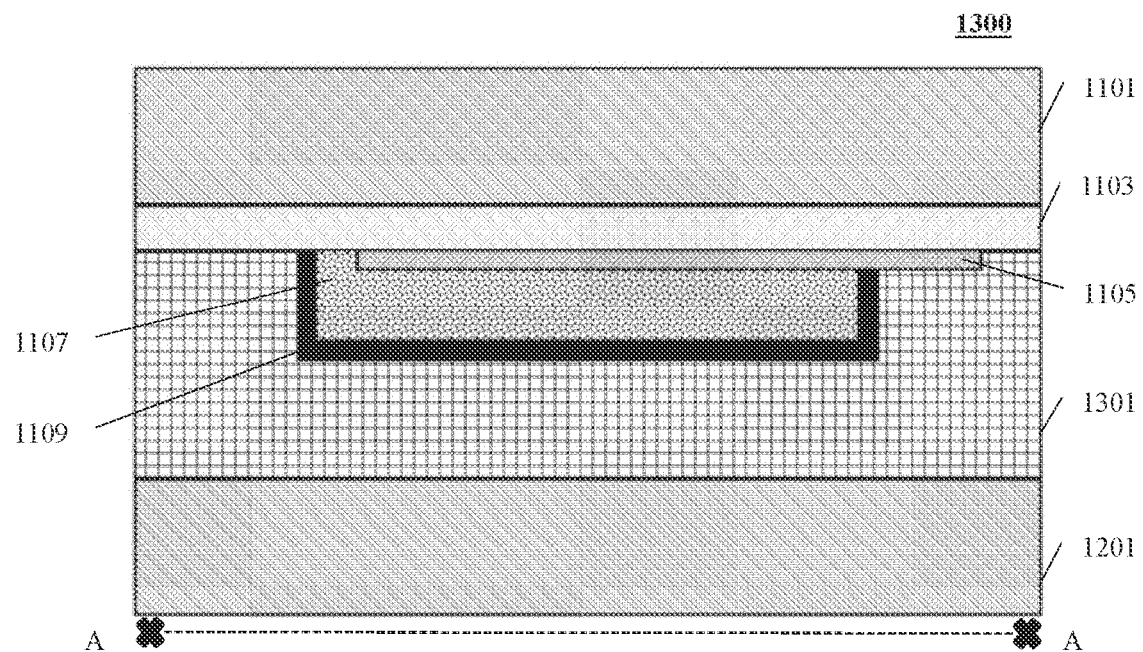

In some embodiments, referring to FIG. 13, the method further includes: bonding the intermediate layer 1111 and the intermediate layer 1203 to form an intermediate layer 1301.

In some embodiments, a thickness of the intermediate layer 1301 is within but not limited to a range from 0.1 micrometer to 10 micrometers.

In some embodiments, bonding the intermediate layer 1111 and the intermediate layer 1203 includes: wafer bonding the intermediate layer 1111 and the intermediate layer 1203 to form the intermediate layer 1301. In some embodiments, the wafer bonding adopts but is not limited to one of polymer bonding technology and insulating dielectric bonding technology. In some embodiments, the polymer bonding technology includes: coating a polymer on a wafer; drying the polymer after the polymer is completely flat; and bonding the wafer. In some embodiments, the insulating dielectric bonding technology includes: forming an insulating dielectric layer on a wafer; planarizing the insulating dielectric layer; and bonding the wafer.

It should be noted that acoustic impedance of the intermediate layer 1301 may be relatively smaller to that of the piezoelectric layer 1103 to reduce leaky waves propagating from the resonance region to the substrate 1201.

Figure 14:
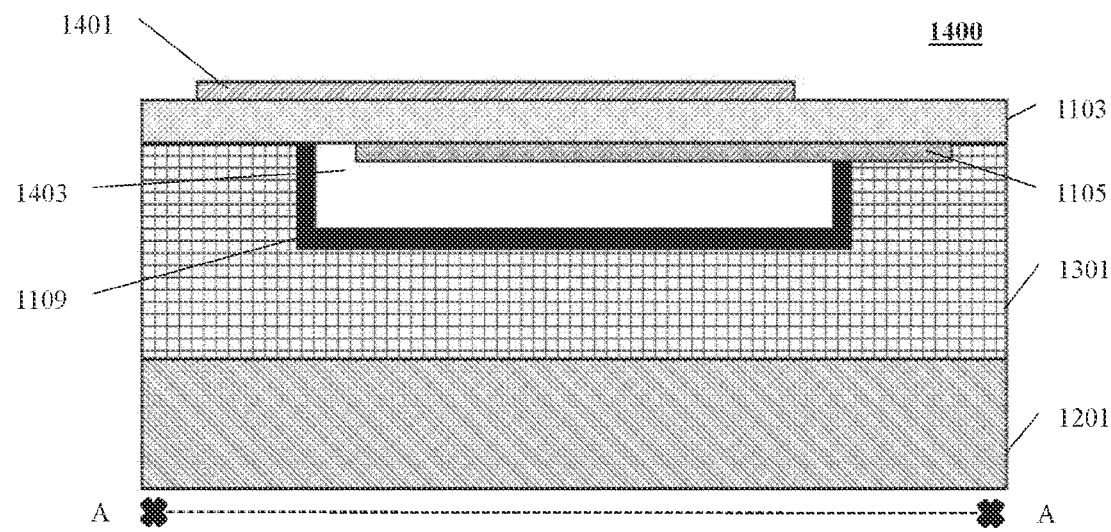

In some embodiments, referring to FIG. 14, the method further includes:
 removing the substrate 1101;
 forming an electrode layer 1401 at the second side of the piezoelectric layer 1103 and in contact with the piezoelectric layer 1103, and the second side of the piezoelectric layer 1103 is opposite to the first side of the piezoelectric layer 1103; and
 removing the sacrificial layer 1107 by etching to form the cavity 1403, and the first end of the electrode layer 1105 is disposed in the cavity 1403.

In some embodiments, the electrode layer 1401 is made of one or more materials selected from but not limited to a group consisting of molybdenum, ruthenium, tungsten, platinum, iridium and aluminum.

In some embodiments, an etching method may include but is not limited to oxygen ion etching, hydrofluoric acid etching, and xenon difluoride etching.

It should be noted that the substrate 1201 and the active layers (including at least the piezoelectric layer 1103, the electrode layer 1105, and the electrode layer 1401) may be processed separately, which allows the forming method of the resonant device to be flexible.

In addition, the etching shield layer 1109 may serve to protect the intermediate layer 1301 when the sacrificial layer 1107 is removed to form the cavity 1403. In addition, the etching shield layer 1109 may serve to protect the resonance device from being corroded by water or oxygen.

In addition, an overlap region among the electrode layer 1105, the piezoelectric layer 1103 and the electrode layer 1401 forms the resonance region which is suspended relative to the cavity 1403, and does not overlap with the intermediate layer 1301.

FIGS. 15 to 18 illustrate schematic structural views of a cross-section A in a method for forming a bulk acoustic wave resonance device according to an embodiment of the present disclosure.

Figure 15:
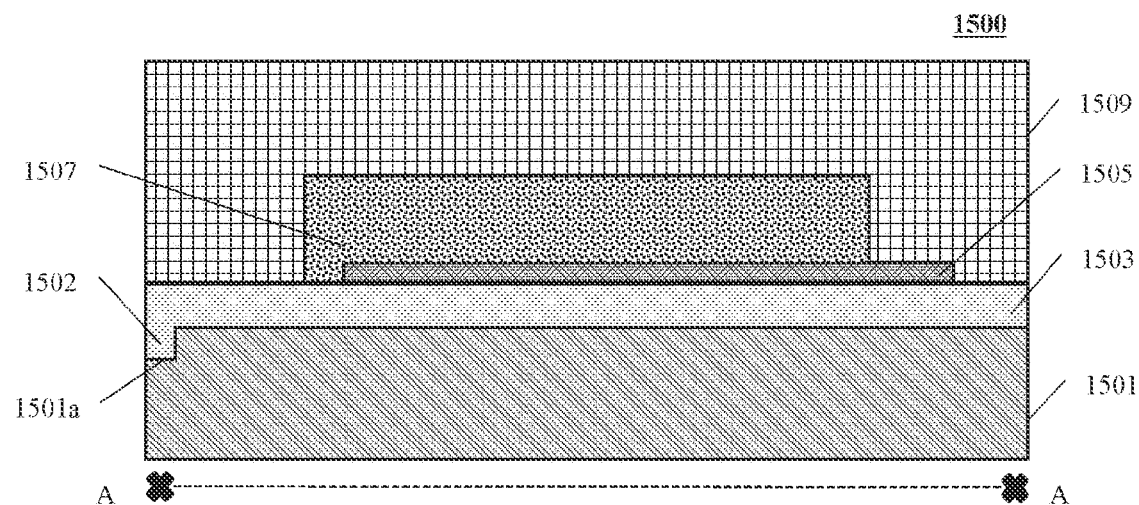
FIGS. 15 to 18 illustrate schematic structural views of cross-sections in a method for forming a bulk acoustic wave resonance device according to an embodiment of the present disclosure.

As shown in FIG. 15, the method includes: forming a first stack, and forming the first stack includes:
providing a substrate 1501;
forming an opening 1501a at an end of the substrate 1501;
forming a photoetching mark 1502 in the opening 1501a;
forming a piezoelectric layer 1503 on the substrate 1501 and the photoetching mark 1502;
forming an electrode layer 1505 on the piezoelectric layer 1503, and the electrode layer 1505 is disposed at a first side of the piezoelectric layer 1503; and
forming a sacrificial layer 1507 on the piezoelectric layer 1503 and covering a first end of the electrode layer 1505.
forming an intermediate layer 1509 disposed on and in contact with the piezoelectric layer 1503 and covering the sacrificial layer 1507 and a second end of the electrode layer 1505.

In some embodiments, the substrate 1501 is made of one or more materials selected from but not limited to a group consisting of silicon, silicon carbide and glass.

In some embodiments, the photoetching mark 1502 is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the piezoelectric layer 1503 is made of one or more materials selected from but not limited to a group consisting of aluminum nitride, aluminum nitride alloy, gallium nitride, zinc oxide, lithium tantalate, lithium niobate, lead zirconate titanate, and lead magnesium niobate-lead titanate. In some embodiments, the photoetching mark 1502 and the piezoelectric layer 1503 may be made of the same material. In some embodiments, the photoetching mark 1502 and the piezoelectric layer 1503 may be made of different materials.

In some embodiments, the piezoelectric layer 1503 includes crystal grains. Crystal grains include a first crystal grain and a second crystal grain, and the first crystal grain and the second crystal grain are any two crystal grains of crystal grains. In some embodiments, crystal grain orientation and crystal plane of a crystal grain can be represented based on a coordinate system. As shown in FIG. 19, a hexagonal crystal grain, such as an aluminum nitride crystal grain, may be represented by an ac stereoscopic coordinate system (including a-axis and c-axis). As shown in FIG. 20, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction is within a range from 0 degree to 5 degrees, and the first direction being opposite to the second direction means that the included angle between the vector along the first direction and the vector along the second direction is within a range from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same orientation or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction is within a range from 0 degree to 5 degrees, and the third direction being opposite to the fourth direction means that the included angle between the vector along the third direction and the vector along the fourth direction is within a range from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1503 includes crystal grains, and a crystal composed of crystal grains has a full width at half maximum of a rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve represents a crystal quality, and the smaller the full width at half maximum of the rocking curve is, the higher the crystal quality is. In addition, the Full Width at Half Maximum (FWHM) refers to an interval between two points whose function values are equal to a half of a peak value of the function.

In some embodiments, the electrode layer 1505 is made of one or more materials selected from but not limited to a group consisting of molybdenum, ruthenium, tungsten, platinum, iridium and aluminum.

In some embodiments, the sacrificial layer 1507 is made of one or more materials selected from but not limited to a group consisting of polymer, silicon dioxide, doped silicon dioxide, and polysilicon. In some embodiments, the polymer includes at least one selected from but not limited to a group consisting of BCB, photosensitive epoxy resin photoresist, such as SU-8, and polyimide. It should be noted that the doped silicon dioxide includes silicon dioxide doped with other elements.

In some embodiments, the intermediate layer 1509 is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

The piezoelectric layer 1503 is formed on a flat surface of the substrate 1501, which enables the piezoelectric layer 1503 not to include crystal grains which suffer from a significant change to their orientation, to improve an electromechanical coupling factor and a Q value of the resonator device.

Figure 16:
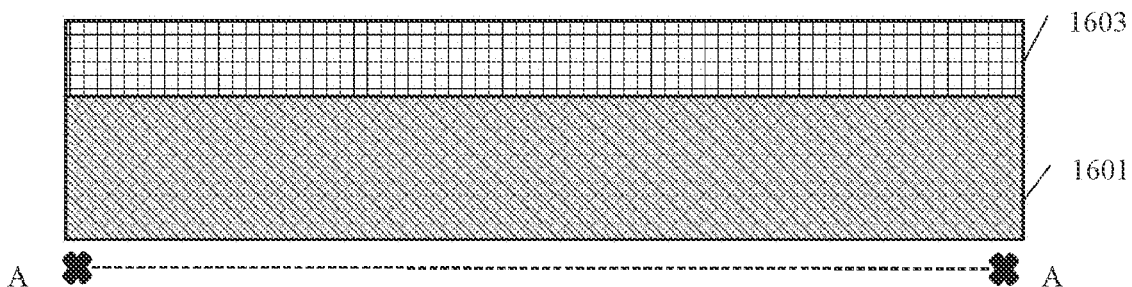

In some embodiments, referring to FIG. 16, the method further includes forming a second stack, and forming the second stack includes.
forming a substrate 1601; and
forming an intermediate layer 1603 on the substrate 1601.

In some embodiments, the substrate 1601 is made of one or more materials selected from but not limited to a group consisting of silicon, silicon carbide and glass.

In some embodiments, the intermediate layer 1603 is made of one or more materials selected from but not limited to a group consisting of polymer and insulating dielectric. In some embodiments, the polymer includes at least one selected from but not limited to a group consisting of BCB, photosensitive epoxy resin photoresist, such as SU-8, and polyimide. In some embodiments, the insulating dielectric includes at least one selected from but not limited to a group consisting of aluminum nitride, silicon dioxide, silicon nitride, and titanium oxide.

Figure 17:
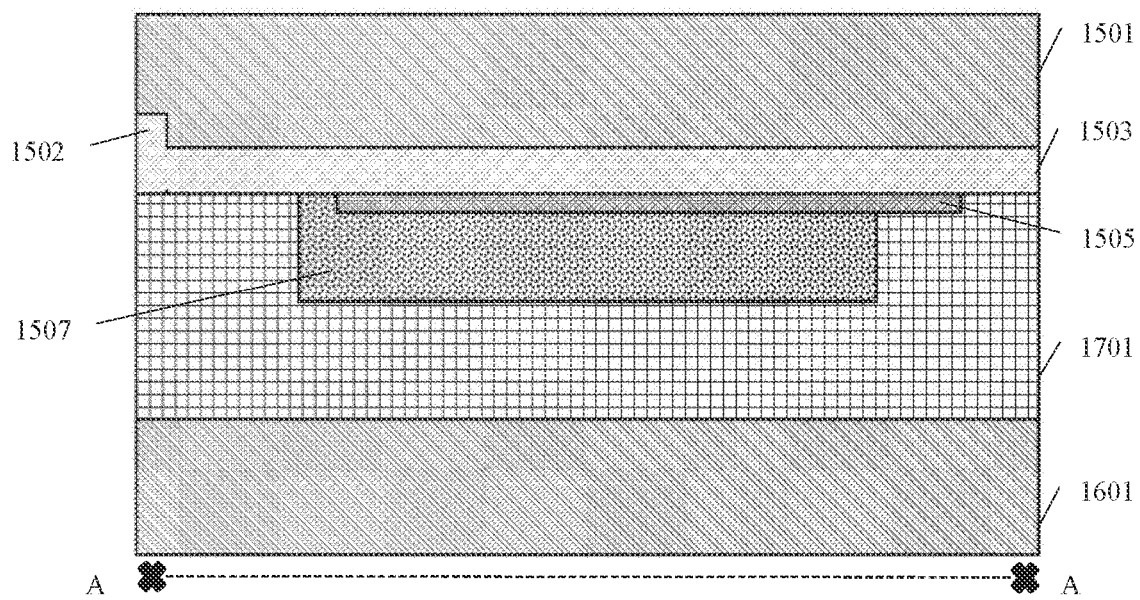

In some embodiments, referring to FIG. 17, the method further includes: bonding the intermediate layer 1509 and the intermediate layer 1603 to form an intermediate layer 1701.

In some embodiments, a thickness of the intermediate layer 1701 is within but not limited to a range from 0.1 micrometer to 10 micrometers.

In some embodiments, bonding the intermediate layer 1509 and the intermediate layer 1603 includes: wafer bonding the intermediate layer 1509 and the intermediate layer 1603 to form the intermediate layer 1701. In some embodiments, the wafer bonding adopts but is not limited to one of polymer bonding technology and insulating dielectric bonding technology. In some embodiments, the polymer bonding technology includes: coating a polymer on a wafer; drying the polymer after the polymer is completely flat; and bonding the wafer. In some embodiments, the insulating dielectric bonding technology includes: forming an insulating dielectric layer on a wafer; planarizing the insulating dielectric layer; and bonding the wafer.

It should be noted that acoustic impedance of the intermediate layer 1701 may be relatively smaller to that of the piezoelectric layer 1503 to reduce leaky waves propagating from the resonance region to the substrate 1601.

Figure 18:
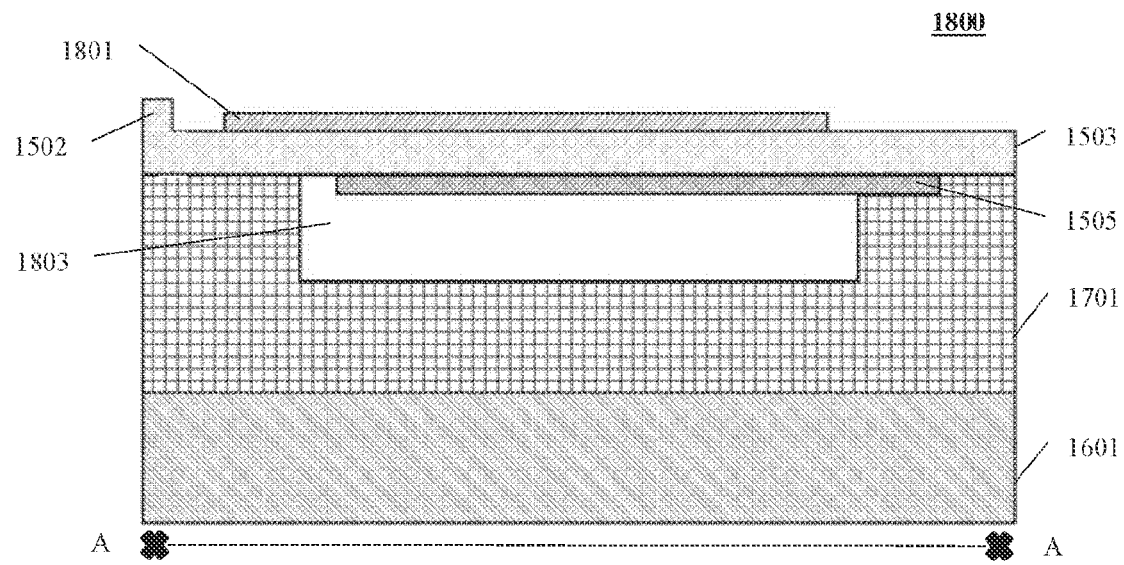

In some embodiments, referring to FIG. 18, the method further includes:
removing the substrate 1501, retaining the photoetching mark 1502 at an end of the piezoelectric layer 1503, and the retained photoetching mark 1502 is disposed at a second side of the piezoelectric layer 1503 and in contact with the piezoelectric layer 1503, and the second side of the piezoelectric layer 1503 is opposite to the first side of the piezoelectric layer 1503;
forming an electrode layer 1801 at the second side of the piezoelectric layer 1503 and in contact with the piezoelectric layer 1503 based on the photoetching mark 1502; and
removing the sacrificial layer 1507 by etching to form the cavity 1803, and the first end of the electrode layer 1505 is disposed in the cavity 1803.

In some embodiments, the electrode layer 1801 is made of one or more materials selected from but not limited to a group consisting of molybdenum, ruthenium, tungsten, platinum, iridium and aluminum.

In some embodiments, an etching method may include but is not limited to oxygen ion etching, hydrofluoric acid etching, and xenon difluoride etching.

It should be noted that the photoetching mark 1502 has a calibration function. During the formation of the edge structure 901 and the electrode layer 1001, alignment with respect to the photoetching mark 1502 improves accuracy.

In addition, the substrate 1601 and the active layers (including at least the piezoelectric layer 1503, the electrode layer 1505, and the electrode layer 1801) may be processed separately, which allows the forming method of the resonant device to be flexible.

In addition, an overlap region among the electrode layer 1505, the piezoelectric layer 1503 and the electrode layer 1801 forms the resonance region which is suspended relative to the cavity 1803, and does not overlap with the intermediate layer 1701.

A piezoelectric layer is formed on a flat surface of a first substrate, which enables the piezoelectric layer not to include crystal grains which suffer from a significant change to their orientation, to improve an electromechanical coupling factor and a Q value of a resonator device. In addition, a second substrate and active layers (including at least the piezoelectric layer, a lower electrode layer, and an upper electrode layer) may be processed separately, which allows a forming method of the resonant device to be flexible. In addition, acoustic impedance of an intermediate layer may be relatively smaller to that of the piezoelectric layer to reduce leaky waves propagating from the resonance region to the second substrate.

The invention claimed is:
1. A method for forming a bulk acoustic wave resonance device, comprising:
forming a first stack, and forming the first stack comprises:

providing a first substrate;

forming a piezoelectric layer on the first substrate;

forming a first electrode layer on the piezoelectric layer; and forming a cavity pretreatment layer on the piezoelectric layer, wherein a cavity is to be formed based on the cavity pretreatment layer, the cavity pretreatment layer at least covers a first end of the first electrode layer and is in contact with the piezoelectric layer, and the cavity pretreatment layer and the piezoelectric layer form an acoustic reflection structure to reduce leaky waves, wherein a first side of the first stack corresponds to a side of the first substrate, and a second side of the first stack corresponds to a side of the cavity pretreatment layer;

forming a second stack, wherein forming the second stack comprises providing a second substrate;

joining the first stack and the second stack, wherein the second stack is disposed at the second side of the first stack;

removing the first substrate, wherein the first side of the first stack corresponds to a side of the piezoelectric layer; and forming a second electrode layer at the first side of the first stack, wherein the second electrode layer is in contact with the piezoelectric layer.

2. The method according to claim 1, wherein forming a cavity pretreatment layer comprises forming a sacrificial layer on the piezoelectric layer and covering the first end of the first electrode layer.

3. The method according to claim 2, wherein the sacrificial layer is made of one or more materials selected from a group consisting of polymer, silicon dioxide, doped silicon dioxide, and polysilicon.

4. The method according to claim 3, wherein the polymer comprises at least one selected from a group consisting of benzocyclobutene, photosensitive epoxy resin photoresist, and polyimide.

5. The method according to claim 2, wherein forming the cavity pretreatment layer further comprises:

forming a first intermediate layer on the piezoelectric layer and covering at least the sacrificial layer, wherein the second side of the first stack corresponds to a side of the first intermediate layer.

6. The method according to claim 5, wherein the first intermediate layer further covers a second end of the first electrode layer.

7. The method according to claim 5, wherein the first intermediate layer is made of one or more materials selected from a group consisting of polymer and insulating dielectric.

8. The method according to claim 7, wherein the polymer comprises at least one selected from a group consisting of benzocyclobutene, photosensitive epoxy resin photoresist, and polyimide.

9. The method according to claim 7, wherein the insulating dielectric comprises at least one selected from a group consisting of aluminum nitride, silicon dioxide, silicon nitride, and titanium oxide.

10. The method according to claim 5, wherein forming the second stack further comprises forming a second intermediate layer on the second substrate.

11. The method according to claim 10, wherein the second intermediate layer is made of one or more materials selected from a group consisting of polymer and insulating dielectric.

12. The method according to claim 11, wherein the polymer comprises at least one selected from a group consisting of benzocyclobutene, photosensitive epoxy resin photoresist, and polyimide.

13. The method according to claim 11, wherein the insulating dielectric comprises at least one selected from a group consisting of aluminum nitride, silicon dioxide, silicon nitride, and titanium oxide.

14. The method according to claim 10, wherein forming the second stack further comprises forming a film between the second substrate and the second intermediate layer.

15. The method according to claim 14, wherein the film comprises a polycrystalline film.

16. The method according to claim 15, wherein the polycrystalline film is made of one or more materials selected from a group consisting of polysilicon, polycrystalline silicon nitride, and polycrystalline silicon carbide.

17. The method according to claim 10, wherein joining the first stack and the second stack comprises: bonding the first intermediate layer and the second intermediate layer to form a third intermediate layer.

18. The method according to claim 17, wherein a thickness of the third intermediate layer is within a range from 0.1 micrometer to 10 micrometers.

19. The method according to claim 5, further comprising:

removing the sacrificial layer to form the cavity, wherein the first end of the first electrode layer is disposed in the cavity.

20. The method according to claim 5, wherein forming the cavity pretreatment layer further comprises:

prior to forming the first intermediate layer, forming an etching shield layer on the piezoelectric layer and covering at least the sacrificial layer.

21. The method according to claim 20, wherein the etching shield layer is made of one or more materials selected from a group consisting of aluminum nitride, silicon carbide, diamond, silicon nitride, silicon dioxide, aluminum oxide and titanium dioxide.

22. The method according to claim 20, wherein the etching shield layer has a thickness within a range from 0.1 micrometer to 3 micrometers.

23. The method according to claim 1, wherein the piezoelectric layer comprises a plurality of crystal grains comprising a first crystal grain and a second crystal grain, wherein the first crystal grain and the second crystal grain are any two crystal grains among the plurality of crystal grains, a first coordinate axis along a first direction corresponds to a height of the first crystal grain, a second coordinate axis along a second direction corresponds to a height of the second crystal grain, and the first direction is the same as or opposite to the second direction.

24. The method according to claim 23, wherein the first crystal grain corresponds to a first coordinate system comprising the first coordinate axis and a third coordinate axis along a third direction, and the second crystal grain corresponds to a second coordinate system comprising the second coordinate axis and a fourth coordinate axis along a fourth direction.

25. The method according to claim 24, wherein the first coordinate system further comprises a fifth coordinate axis along a fifth direction, and the second coordinate system further comprises a sixth coordinate axis along a sixth direction.

26. The method according to claim 25, wherein the third direction is the same as or opposite to the fourth direction.

27. The method according to claim 1, wherein the piezoelectric layer is made of one or more materials selected from a group consisting of aluminum nitride, aluminum nitride alloy, gallium nitride, zinc oxide, lithium tantalate, lithium niobate, lead zirconate titanate, and lead magnesium niobate-lead titanate.

28. The method according to claim 1, wherein the piezoelectric layer comprises a plurality of crystal grains, and a crystal composed of the plurality of crystal grains has a full width at half maximum of a rocking curve less than 2.5 degrees.

29. The method according to claim 1, wherein forming a piezoelectric layer comprises: forming a first sub-piezoelectric layer on the first substrate; and forming a second sub-piezoelectric layer on the first sub-piezoelectric layer.

30. The method according to claim 29, wherein a full width at half maximum of a rocking curve of the first sub-piezoelectric layer is greater than 1.7 degrees, and a full width at half maximum of a rocking curve of the second sub-piezoelectric layer is smaller than 1.7 degrees.

31. The method according to claim 29, further comprising: following removing the first substrate, removing the first sub-piezoelectric layer, wherein the first side of the first stack corresponds to a side of the second sub-piezoelectric layer.

32. The method according to claim 1, wherein forming the first stack further comprises: forming a photoetching mark prior to forming the piezoelectric layer.

33. The method according to claim 32, wherein forming a photoetching mark comprises:
forming an opening at an end of the first substrate; and
forming the photoetching mark in the opening.

34. The method according to claim 32, further comprising:
following removing the first substrate, retaining the photoetching mark at the first side of the first stack and in contact with the piezoelectric layer.

35. The method according to claim 1, further comprising:
prior to forming the second electrode layer, forming an edge structure at the first side of the first stack and in contact with the piezoelectric layer.

36. The method according to claim 35, wherein forming the second electrode layer comprises: forming the second electrode layer at an inner side of the edge structure.

37. The method according to claim 35, wherein forming an edge structure comprises:
forming a metal edge structure at the first side of the first stack and in contact with the piezoelectric layer.

38. The method according to claim 37, wherein forming the edge structure further comprises:
etching an inner side of the metal edge structure to form a slope.

39. The method according to claim 38, wherein an etching angle for etching the inner side of the metal edge structure is within a range from 1 degree to 89 degrees.

* * * * *